US008445886B2

(12) United States Patent  (10) Patent No.: US 8,445,886 B2
Fujii et al.  (45) Date of Patent: May 21, 2013

(54) NONVOLATILE MEMORY ELEMENT, NONVOLATILE MEMORY DEVICE, NONVOLATILE SEMICONDUCTOR DEVICE, AND METHOD OF MANUFACTURING NONVOLATILE MEMORY ELEMENT

(75) Inventors: Satoru Fujii, Osaka (JP); Koji Arita, Osaka (JP); Satoru Mitani, Osaka (JP); Takumi Mikawa, Shiga (JP)

(73) Assignee: Panasonic Corporation, Osaka (JP)

( * ) Notice: Subject to any disclaimer, the term of this patent is extended or adjusted under 35 U.S.C. 154(b) by 37 days.

(21) Appl. No.: 13/147,321

(22) PCT Filed: Feb. 2, 2010

(86) PCT No.: PCT/JP2010/000617
§ 371 (c)(1),
(2), (4) Date: Aug. 1, 2011

(87) PCT Pub. No.: WO2010/087211
PCT Pub. Date: Aug. 5, 2010

(65) Prior Publication Data
US 2011/0284816 A1  Nov. 24, 2011

(30) Foreign Application Priority Data
Feb. 2, 2009  (JP) ................................. 2009-021633

(51) Int. Cl.
*H01L 29/02*  (2006.01)
(52) U.S. Cl.
USPC ..... 257/2; 257/3; 257/4; 257/5; 257/E29.002; 438/102; 438/103; 438/104; 365/163
(58) Field of Classification Search
USPC .... 257/2–5, E29.002; 438/102–104; 365/163
See application file for complete search history.

(56) References Cited

U.S. PATENT DOCUMENTS

| 4,589,969 A | * | 5/1986 | Yurkov et al. | ............ 204/290.13 |
| 7,236,388 B2 | * | 6/2007 | Hosoi et al. | .................... 365/148 |

(Continued)

FOREIGN PATENT DOCUMENTS

DE  2840995 A1 *  4/1979
JP  05-110011  4/1993

(Continued)

OTHER PUBLICATIONS

Fujimoto, M., et al. "High-Speed Resistive Switching of $TiO_2$/TiN Nano-Crystalline Thin Film", Japanese Journal of Applied Physics, 2006, pp. L310-L312, vol. 45 No. 11, The Japan Society of Applied Physics.

(Continued)

*Primary Examiner* — Jami M Valentine
(74) *Attorney, Agent, or Firm* — McDermott Will & Emery LLP

(57) ABSTRACT

A nonvolatile memory element comprises a first electrode (103); a second electrode (105); and a resistance variable layer (104) disposed between the first electrode (103) and the second electrode (105), resistance values of the resistance variable layer reversibly changing in response to electric signals applied between the electrodes (103, 105); the resistance variable layer (104) including a first tantalum oxide layer (107) comprising a first tantalum oxide and a second tantalum oxide layer (108) comprising a second tantalum oxide which is different in oxygen content from the first tantalum oxide, the first tantalum oxide layer and the second tantalum oxide layer being stacked together, and being configured such that $0<x<2.5$ is satisfied when the first tantalum oxide is expressed as $TaO_x$ and $x<y\leq 2.5$ is satisfied when the second tantalum oxide is expressed as $TaO_y$; and the second electrode (105) being in contact with the second tantalum oxide layer (108) and comprising platinum and tantalum.

19 Claims, 26 Drawing Sheets

U.S. PATENT DOCUMENTS

| | | | |
|---|---|---|---|
| 2004/0235247 A1 | 11/2004 | Hsu et al. | |
| 2004/0245557 A1 | 12/2004 | Seo et al. | |
| 2005/0206892 A1 | 9/2005 | Wang et al. | |
| 2005/0207265 A1 | 9/2005 | Hsu et al. | |
| 2005/0226036 A1 | 10/2005 | Aratani et al. | |
| 2006/0281277 A1 | 12/2006 | Tamai et al. | |
| 2007/0114587 A1 | 5/2007 | Seo et al. | |
| 2007/0140900 A1 | 6/2007 | Wang et al. | |
| 2007/0153267 A1 | 7/2007 | Wang et al. | |
| 2007/0153269 A1 | 7/2007 | Wang et al. | |
| 2007/0183101 A1 | 8/2007 | Yoon et al. | |
| 2007/0229817 A1 | 10/2007 | Wang et al. | |
| 2008/0083918 A1 | 4/2008 | Aratani et al. | |
| 2008/0157228 A1* | 7/2008 | Chambers et al. | 257/407 |
| 2008/0296550 A1 | 12/2008 | Lee et al. | |
| 2008/0309918 A1 | 12/2008 | Guo et al. | |
| 2009/0046284 A1 | 2/2009 | Wang et al. | |
| 2009/0066946 A1 | 3/2009 | Wang et al. | |
| 2009/0086202 A1 | 4/2009 | Wang et al. | |
| 2009/0224224 A1 | 9/2009 | Fujii et al. | |
| 2009/0283736 A1* | 11/2009 | Kanzawa et al. | 257/2 |
| 2009/0309088 A1 | 12/2009 | Sakamoto | |
| 2010/0051892 A1 | 3/2010 | Mikawa et al. | |
| 2010/0070197 A1 | 3/2010 | Wang et al. | |
| 2010/0085564 A1 | 4/2010 | Guo et al. | |
| 2010/0110424 A1 | 5/2010 | Wang et al. | |
| 2010/0114514 A1 | 5/2010 | Wang et al. | |
| 2010/0135060 A1 | 6/2010 | Aratani et al. | |
| 2010/0296086 A1 | 11/2010 | Wang et al. | |
| 2011/0073825 A1 | 3/2011 | Aratani et al. | |
| 2011/0140209 A1 | 6/2011 | Wang et al. | |

FOREIGN PATENT DOCUMENTS

| | | |
|---|---|---|
| JP | 06-291078 | 10/1994 |
| JP | 09-260603 | 10/1997 |
| JP | 2006-120701 | 5/2006 |

OTHER PUBLICATIONS

Lee, C.B., et al., "Electromigration effect of Ni electrodes on the resistive switching charcateristics of NiO thin films", Applied Physics Letters, 2007, vol. 91, American Institute of Physics.

* cited by examiner

HIGH-DEGREE OXIDIZATION LAYER THICKNESS : 8.0nm

HIGH-DEGREE OXIDIZATION LAYER THICKNESS : 3.6nm

Pt=89atm%

Pt=92atm%

Pt/Ta=100/0

Pt/Ta=95/5

Pt/Ta=92/8

NONVOLATILE MEMORY ELEMENT, NONVOLATILE MEMORY DEVICE, NONVOLATILE SEMICONDUCTOR DEVICE, AND METHOD OF MANUFACTURING NONVOLATILE MEMORY ELEMENT

RELATED APPLICATIONS

This application is the U.S. National Phase under 35 U.S.C. §371 of International Application No. PCT/JP2010/000617, filed on Feb. 2, 2010, which in turn claims the benefit of Japanese Application No. 2009-021633, filed on Feb. 2, 2009, the disclosures of which Applications are incorporated by reference herein.

TECHNICAL FIELD

The present invention relates to a nonvolatile memory element, a nonvolatile memory device, a nonvolatile semiconductor device and a method of manufacturing the nonvolatile memory element. Particularly, the present invention relates to a resistance variable nonvolatile memory element, a resistance variable nonvolatile memory device, a resistance variable nonvolatile semiconductor device and a method of manufacturing the resistance variable nonvolatile memory element, in which its resistance values change in response to electric signals applied thereto.

BACKGROUND ART

With recent advancement of digital technologies, electronic equipment such as portable information devices and home information appliances have been developed to provide higher functionality. For this reason, demands for an increase in a capacity of a nonvolatile memory element, reduction in a write electric power in the nonvolatile memory element, reduction in write/read time in the nonvolatile memory element, and longer life of the nonvolatile memory element are now increasing.

Under the circumstances in which there are such demands, it is said that there is a limitation on miniaturization of the existing flash memory using a floating gate. On the other hand, a nonvolatile memory element (resistance variable memory) using a resistance variable layer as a material of a memory section is formed by a memory element having a simple structure in which the resistance variable layer is sandwiched between a pair of electrodes. Therefore, further miniaturization, a higher-speed, and lower electric power consumption of the nonvolatile memory element are expected.

When using the resistance variable layer as the memory section, the resistance variable layer changes from a high-resistance state to a low-resistance state or from the low-resistance state to the high-resistance state, for example, by applying electric pulses. In this case, it is necessary to clearly distinguish between these two states, i.e., the high-resistance state and the low-resistance state, to enable changing between the low-resistance state and the high-resistance state stably at a high-speed, and to retain these two states in a nonvolatile manner. For the purpose of stabilization of such memory characteristics and miniaturization of memory elements, a variety of proposals have been proposed heretofore.

As one of such proposals, there is known a nonvolatile memory element using tantalum oxide as a resistance variable material forming a resistance variable layer (e.g., Patent Literature 1). This tantalum oxide is binary, and therefore its composition control and layer fabrication are relatively easy. Besides, it could be said that the tantalum oxide has a relatively high compatibility with semiconductor manufacturing process steps.

CITATION LISTS

Patent Literature

Patent Literature 1: International Publication No. 2008/059701

SUMMARY OF THE INVENTION

Technical Problem

In the nonvolatile memory element using the above mentioned tantalum oxide as the resistance variable material, platinum (Pt), iridium (Ir), copper (Cu), gold (Au), silver (Ag), etc., are used, as the electrode materials. Among these materials, it may be said that platinum is a suitable electrode material, because the nonvolatile memory element using platinum as the electrode material operates (changes its resistance) at low voltages.

However, there exists a problem that a resistance changing characteristic of the nonvolatile memory element varies when platinum is used as the electrode material.

The present invention has been developed to solve aforesaid problems, and an object of the present invention is to provide a nonvolatile memory element which uses tantalum oxide as a resistance variable material and platinum as an electrode material and can reduce a variation in its resistance changing characteristic, a nonvolatile memory device and a nonvolatile semiconductor device including the nonvolatile memory element, and a manufacturing method of the nonvolatile memory element.

Solution to Problem

To achieve the above mentioned objective, the inventors intensively studied a cause of a variation in the resistance changing characteristic of the nonvolatile memory element using platinum as the electrode material, and reached the following conclusion. To be specific, it is reported that minute projections named hillocks are formed in a platinum electrode layer. If the hillocks formed in the electrode are great in size in the nonvolatile memory element using platinum as the electrode material, there is a possibility that a pair of electrodes sandwiching the resistance variable layer contact each other and a current leaks. If the hillocks reach the resistance variable layer, platinum elements would diffuse into the resistance variable layer. It is supposed that an electric field concentrates on the hillocks. It may be considered that if the hillocks are formed irregularly among nonvolatile memory elements, a resistance value and a current value in a resistance changing phenomenon are varied among nonvolatile memory elements.

From the above, the inventors reached a conclusion that a variation in the resistance changing characteristic of the nonvolatile memory element using platinum as the electrode material could be caused by the hillocks formed in the electrode comprising platinum.

A resistance changing mechanism of the nonvolatile memory element using tantalum oxide as the resistance variable material of the resistance variable layer is considered to be a phenomenon in which oxygen migrates to get together in a region of the resistance variable layer which is in the vicinity of an interface with the electrode and scatter away therefrom by applying voltages to the electrode, causing a resistance value of the region of the resistance variable layer in the vicinity of the interface to increase or decrease and hence a resistance value of the overall resistance variable layer to increase or decrease, which will be explained in detail later.

Through an experiment or the like, the inventors discovered findings that resistance change occurred more easily when a standard electrode potential of a material (hereinafter referred to as electrode material) constituting an electrode is higher relative to a standard electrode potential of transition metal (herein tantalum) of transition metal oxide constituting the resistance variable layer. Among the electrode materials disclosed in Patent Literature 1, platinum is highest in standard electrode potential relative to tantalum, which is therefore considered to greatly contribute to the fact that the nonvolatile memory element using platinum as the electrode material operates at low voltages. However, if the hillocks are present in the electrode, an electric field concentrates on the hillocks and an electric field intensity generated in the resistance variable layer increases. Therefore, it may be presumed that the presence of the hillocks contributes to a substantial extent to the fact that the nonvolatile memory element using platinum as the electrode material operates at low voltages.

In view of the above, it is not always a good idea to completely prevent the hillocks from being formed in the electrode to eliminate a variation in the resistance changing characteristic of the nonvolatile memory element using platinum as the electrode material. Accordingly, it could be considered that the degree to which the hillocks are formed can be controlled by using alloy of platinum and another metal as the electrode material. In this case, a standard electrode electric potential of the alloy relative to tantalum must be taken into account.

A nonvolatile memory element of the present invention comprises a first electrode; a second electrode; and a resistance variable layer disposed between the first electrode and the second electrode, resistance values of the resistance variable layer reversibly changing in response to electric signals applied between the first electrode and the second electrode; the resistance variable layer including a first tantalum oxide layer comprising a first tantalum oxide and a second tantalum oxide layer comprising a second tantalum oxide which is different in oxygen content from the first tantalum oxide, the first tantalum oxide layer and the second tantalum oxide layer being stacked together, and being configured such that $0<x<2.5$ is satisfied when the first tantalum oxide is expressed as $TaO_x$ and $x<y\leq2.5$ is satisfied when the second tantalum oxide is expressed as $TaO_y$; and the second electrode being in contact with the second tantalum oxide layer and comprising platinum and tantalum.

In accordance with this configuration, since the second electrode comprises platinum and tantalum, the degree to which the hillocks are formed can be controlled. As a result, a variation in the resistance changing characteristic of the nonvolatile memory element can be lessened. In addition, since the second electrode comprises tantalum, adhesivity to an interlayer insulating layer can be improved.

It is preferable that the second electrode has a platinum content which is not less than 27 atm % and not more than 92 atm %.

Furthermore, it is preferable that the second electrode has a platinum content which is not less than 56 atm % and not more than 92 atm %.

This configuration enables the nonvolatile memory element to change its resistance and to reduce its variation.

It is preferable that when a thickness of the second tantalum oxide layer is Y(nm), an upper limit value of the platinum content of the second electrode is a value expressed as [3.65Y+60.7] (atm %).

A nonvolatile memory device of the present invention comprises a semiconductor substrate; and a memory array including a plurality of first wires formed on the semiconductor substrate to extend in parallel with each other; a plurality of second wires formed above the plurality of first wires to extend in parallel with each other within a plane parallel to a main surface of the semiconductor substrate and to three-dimensionally cross the plurality of first wires, respectively; nonvolatile memory elements which are provided to respectively correspond to three-dimensional cross points of the plurality of first wires and the plurality of second wires; and current controlling elements having a non-linear current-voltage characteristic; each of the nonvolatile memory elements including: a first electrode disposed between a corresponding one of the first wires and a corresponding one of the second wires and electrically connected to the first wire; a second electrode electrically connected to the second wire; and a resistance variable layer disposed between the first electrode and the second electrode, resistance values of the resistance variable layer reversibly changing in response to electric signals applied between the first electrode and the second electrode; the resistance variable layer including a first tantalum oxide layer comprising a first tantalum oxide and a second tantalum oxide layer comprising a second tantalum oxide which is different in oxygen content from the first tantalum oxide, the first tantalum oxide layer and the second tantalum oxide layer being stacked together, and being configured such that $0<x<2.5$ is satisfied when the first tantalum oxide is expressed as $TaO_x$ and $x<y\leq2.5$ is satisfied when the second tantalum oxide is expressed as $TaO_y$; and the second electrode being in contact with the second tantalum oxide layer and comprising platinum and tantalum.

The nonvolatile memory device may comprise a multi-layer memory array in which a plurality of layers of the memory array are stacked together on the semiconductor substrate.

A nonvolatile memory device of the present invention comprises a semiconductor substrate; a plurality of word lines formed on the semiconductor substrate to extend in parallel with each other; a plurality of bit lines formed to extend in parallel with each other and arranged to three-dimensionally cross the plurality of word lines, respectively; a plurality of plate lines formed to extend in parallel with each other and arranged in parallel with either the plurality of word lines or the plurality of bit lines; a plurality of transistors provided to respectively correspond to three-dimensional cross points of the plurality of word lines and the plurality of bit lines, respectively; and a plurality of nonvolatile memory elements provided to respectively correspond to the plurality of transistors such that one nonvolatile memory element corresponds to one transistor; each of the plurality of nonvolatile memory elements including a first electrode, a second electrode, and a resistance variable layer disposed between the first electrode and the second electrode, resistance values of the resistance variable layer changing reversibly in response to electric signals applied between a corresponding one of the bit lines and a corresponding one of the plate lines and applied between the first electrode and the second electrode via a corresponding one of the transistors; one of the first electrode and the second electrode of the nonvolatile memory element being connected to one of a source and a drain of a corresponding one of the transistors; gates of the plurality of transistors being connected to corresponding ones of the word lines, respectively;

the other of the first electrode and the second electrode of the nonvolatile memory element being connected to one of either a corresponding one of the bit lines or a corresponding one of the plate lines; the other of the source and the drain of the transistor is connected to the other of either the corresponding one of the bit lines or the corresponding one of the plate lines; the resistance variable layer including a first tantalum oxide layer comprising a first tantalum oxide and a second tantalum oxide layer comprising a second tantalum oxide which is different in oxygen content from the first tantalum oxide, the first tantalum oxide layer and the second tantalum oxide layer being stacked together, and being configured such that $0<x<2.5$ is satisfied when the first tantalum oxide is expressed as $TaO_x$ and $x<y\leqq 2.5$ is satisfied when the second tantalum oxide is expressed as $TaO_y$; and the second electrode being in contact with the second tantalum oxide layer and comprising platinum and tantalum.

A nonvolatile semiconductor device of the present invention comprises a semiconductor substrate; a logic circuit provided on the semiconductor substrate, for executing predetermined calculation; and a nonvolatile memory element provided on the semiconductor substrate and having a programming function; the nonvolatile memory element comprising: a first electrode; a second electrode; and a resistance variable layer disposed between the first electrode and the second electrode, resistance values of the resistance variable layer reversibly changing in response to electric signals applied between the first electrode and the second electrode; the resistance variable layer including a first tantalum oxide layer comprising a first tantalum oxide and a second tantalum oxide layer comprising a second tantalum oxide which is different in oxygen content from the first tantalum oxide, the first tantalum oxide layer and the second tantalum oxide layer being stacked together, and being configured such that $0<x<2.5$ is satisfied when the first tantalum oxide is expressed as $TaO_x$ and $x<y\leqq 2.5$ is satisfied when the second tantalum oxide is expressed as $TaO_y$; and the second electrode being in contact with the second tantalum oxide layer and comprising platinum and tantalum.

A method of manufacturing a nonvolatile memory element of the present invention, including: a first electrode; a second electrode; and a resistance variable layer disposed between the first electrode and the second electrode, resistance values of the resistance variable layer reversibly changing in response to electric signals applied between the first electrode and the second electrode; the resistance variable layer including a first tantalum oxide layer comprising a first tantalum oxide and a second tantalum oxide layer comprising a second tantalum oxide which is different in oxygen content from the first tantalum oxide, the first tantalum oxide layer and the second tantalum oxide layer being stacked together, and being configured such that $0<x<2.5$ is satisfied when the first tantalum oxide is expressed as $TaO_x$ and $x<y\leqq 2.5$ is satisfied when the second tantalum oxide is expressed as $TaO_y$; and the second electrode being in contact with the second tantalum oxide layer and comprising platinum and tantalum, the method comprising: forming the second electrode by cosputtering using a platinum target and a tantalum target, a composition of the second electrode comprising the platinum and the tantalum being controlled by regulating a power intensity applied to each of the targets.

A method of manufacturing a nonvolatile memory element of the present invention, including: a first electrode; a second electrode; and a resistance variable layer disposed between the first electrode and the second electrode, resistance values of the resistance variable layer reversibly changing in response to electric signals applied between the first electrode and the second electrode; the resistance variable layer including a first tantalum oxide layer comprising a first tantalum oxide and a second tantalum oxide layer comprising a second tantalum oxide which is different in oxygen content from the first tantalum oxide, the first tantalum oxide layer and the second tantalum oxide layer being stacked together, and being configured such that $0<x<2.5$ is satisfied when the first tantalum oxide is expressed as $TaO_x$ and $x<y\leqq 2.5$ is satisfied when the second tantalum oxide is expressed as $TaO_y$; and the second electrode being in contact with the second tantalum oxide layer and comprising platinum and tantalum, the method comprising: forming a material of the second electrode comprising the platinum and the tantalum by sputtering using a target comprising alloy composed of the platinum and the tantalum.

Advantageous Effects of the Invention

The present invention is configured as described above, and achieves an advantage that it is possible to provide a nonvolatile memory element, or the like which uses tantalum oxide as a resistance variable material and platinum as an electrode material and can reduce a variation in its resistance changing characteristic.

BRIEF DESCRIPTION OF THE DRAWINGS

FIGS. 3A and 3B are views showing relationships each of which is between a platinum content of an electrode layer and an initial resistance value in the nonvolatile memory element according to Embodiment 1 of the present invention, in which FIG. 3A shows a relationship in a case where a high-degree oxidization layer has a thickness of 8.0 nm, and FIG. 3B shows a relationship in a case where a high-degree oxidization layer has a thickness of 3.6 nm.

Figure 8A:
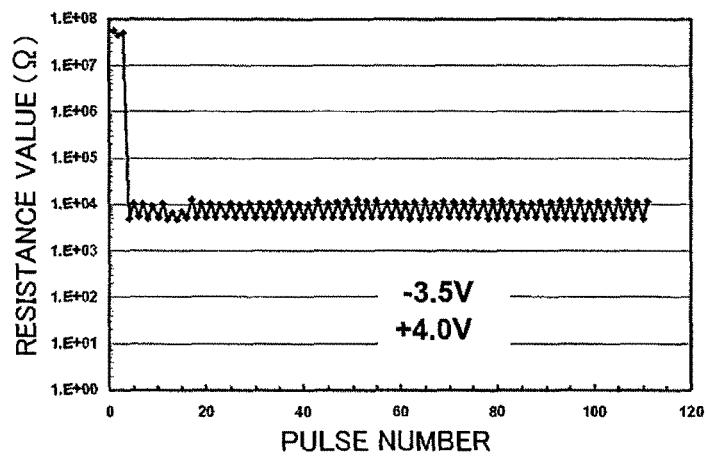
FIG. 8A is a view showing a relationship between the resistance value of the resistance variable layer included in the nonvolatile memory element according to Embodiment 1 of the present invention, and the number of times pulses are applied, and showing a relationship in a case where the platinum content of the second electrode layer is 27 atm %.
Figure 8B:
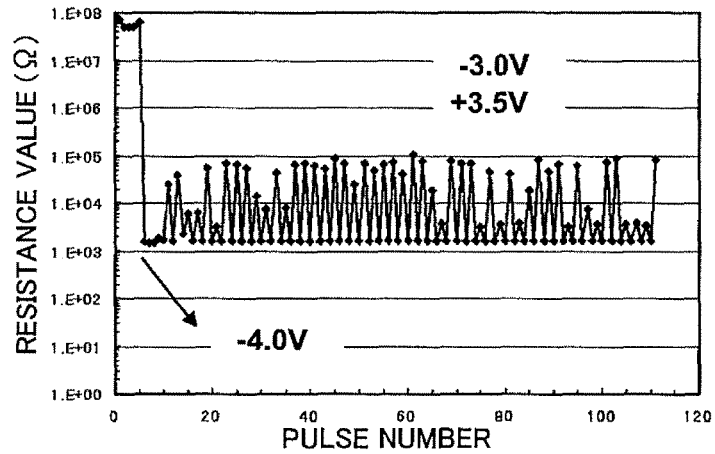
FIG. 8B is a view showing a relationship between the resistance value of the resistance variable layer included in the nonvolatile memory element according to Embodiment 1 of the present invention, and the number of times pulses are applied, and showing a relationship in a case where the platinum content of the second electrode layer is 70 atm %.
Figure 8C:
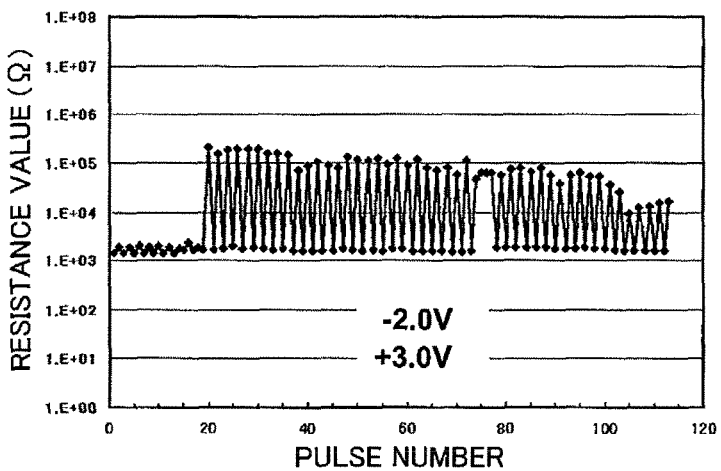

FIG. 8C is a view showing a relationship between the resistance value of the resistance variable layer included in the nonvolatile memory element according to Embodiment 1 of the present invention, and the number of times pulses are applied, and showing a relationship in a case where the platinum content of the second electrode layer is 86 atm %.

Figure 8D:
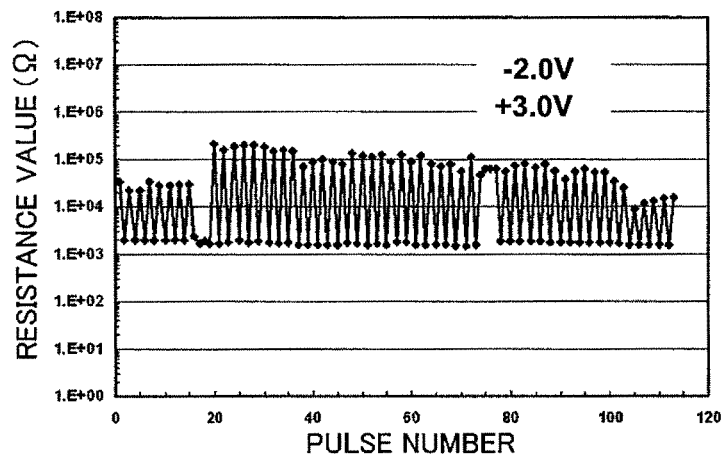

FIG. 8D is a view showing a relationship between the resistance value of the resistance variable layer included in the nonvolatile memory element according to Embodiment 1 of the present invention, and the number of times pulses are applied, and showing a relationship in a case where the platinum content of the second electrode layer is 89 atm %.

Figure 8E:
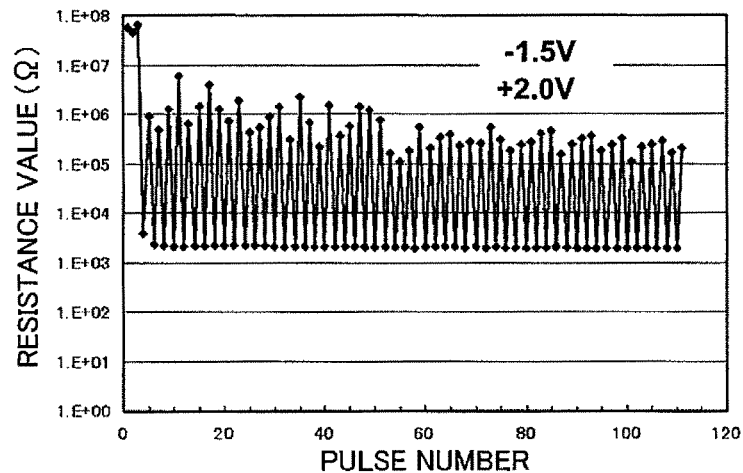

FIG. 8E is a view showing a relationship between the resistance value of the resistance variable layer included in the nonvolatile memory element according to Embodiment 1 of the present invention, and the number of times pulses are applied, and showing a relationship in a case where the platinum content of the second electrode layer is 92 atm %.

Figure 8F:
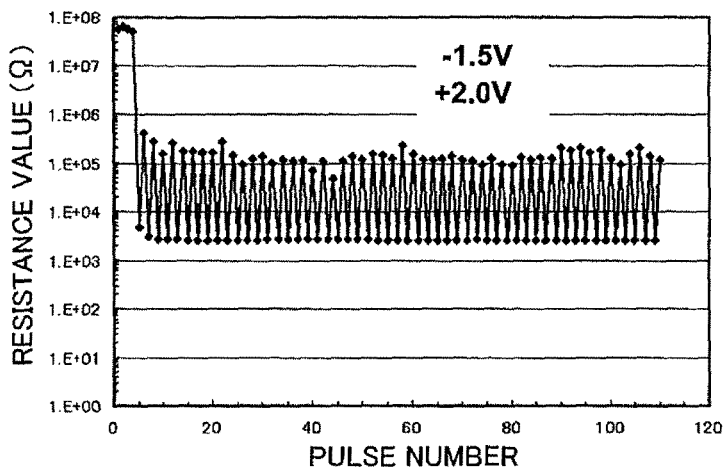

FIG. 8F is a view showing a relationship between the resistance value of the resistance variable layer included in the nonvolatile memory element according to Embodiment 1 of the present invention, and the number of times pulses are applied, and showing a relationship in a case where the platinum content of the second electrode layer is 95 atm %.

Figure 8G:
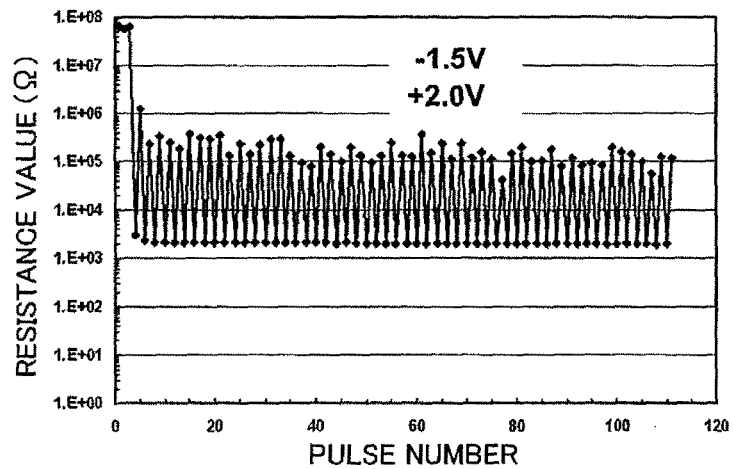

FIG. 8G is a view showing a relationship between the resistance value of the resistance variable layer included in the nonvolatile memory element according to Embodiment 1 of the present invention, and the number of times pulses are applied, and showing a relationship in a case where the platinum content of the second electrode layer is 100 atm %.

Figure 9A:
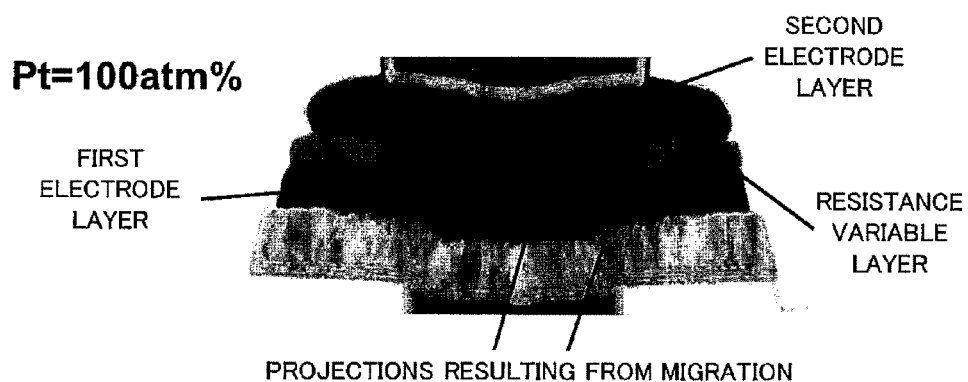
Figure 9B:
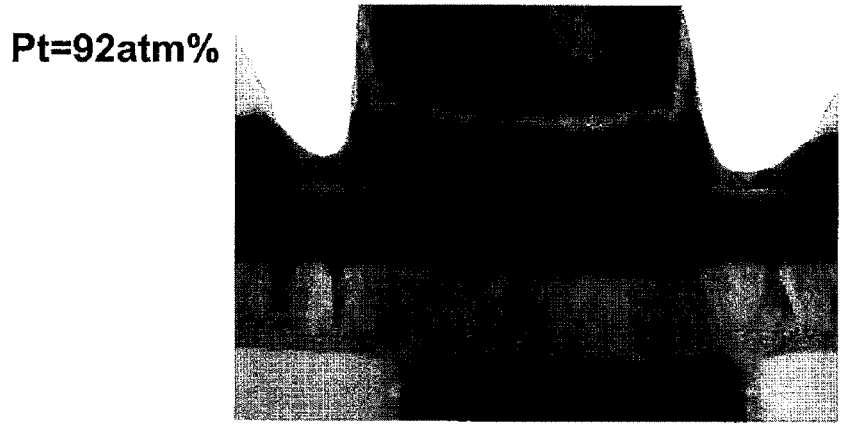
Figure 9C:
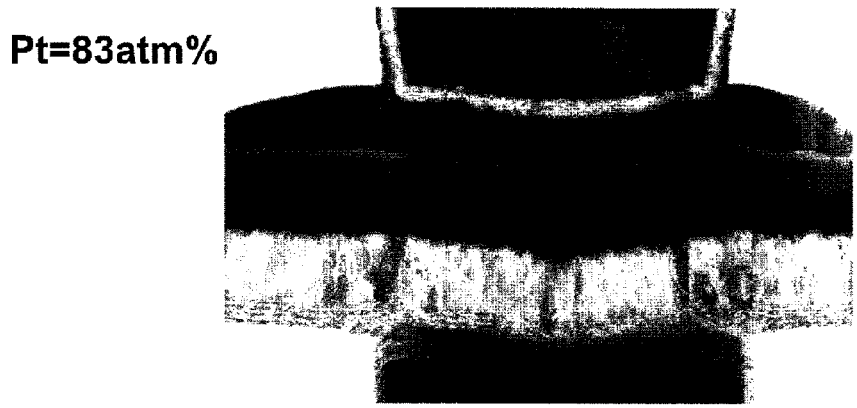

FIGS. 9A to 9C are views showing TEM observation images of cross-sections of a nonvolatile memory element according to Embodiment 1 of the present invention, in which FIG. 9A shows a case where the platinum content of the second electrode layer is 100 atm %, FIG. 9B shows a case where the platinum content of the second electrode layer is 92 atm %, and FIG. 9C shows a case where the platinum content of the second electrode layer is 83 atm %.

Figure 10A:
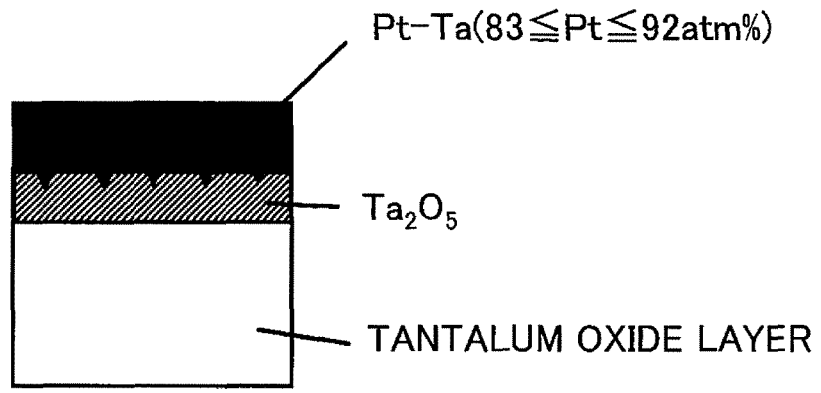
Figure 10B:
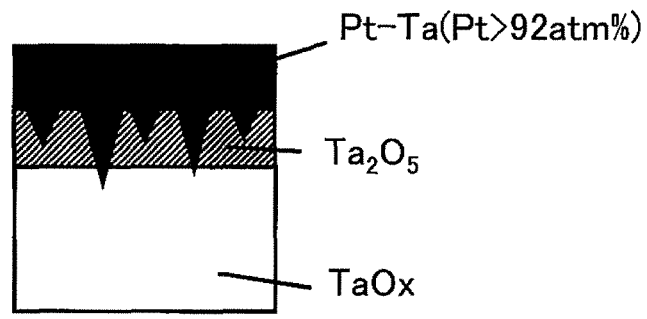
Figure 10C:
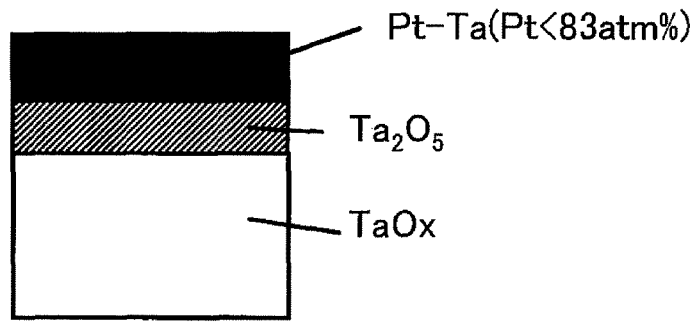

FIG. 10 is model views showing how platinum migrates in the nonvolatile memory element according to Embodiment 1 of the present invention, in which FIG. 10A shows a case where the platinum content of the second electrode layer is not less than 83 atm % and less than 92 atm %, FIG. 103 shows a case where the platinum content of the second electrode layer is not less than 92 atm % and FIG. 10C shows a case where the platinum content of the second electrode layer is less than 83 atm %.

Figure 11:
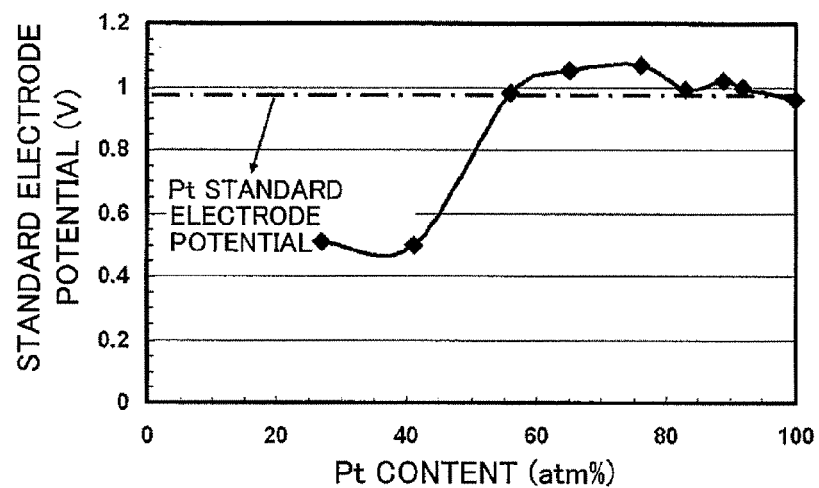

FIG. 11 is a view showing a relationship between a platinum content and a standard electrode potential in a platinum electrode layer material including Ta.

Figure 12:
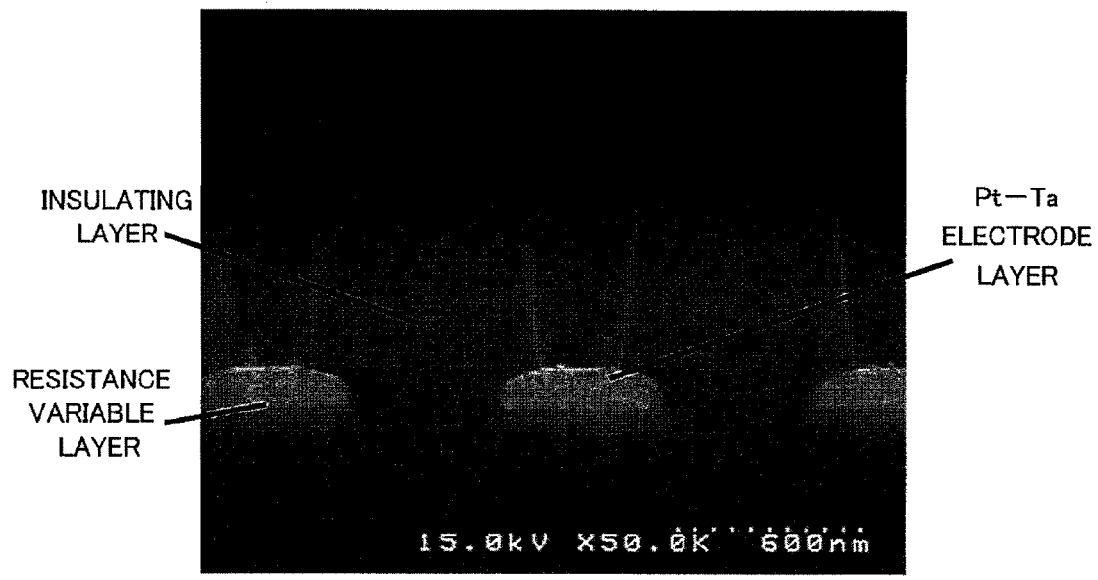

FIG. 12 is a SEM cross-sectional view showing an adhesivity between the platinum electrode layer including Ta and an insulating layer.

Figure 13A:
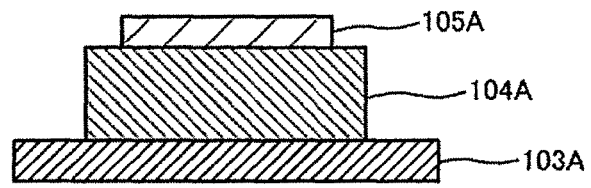
Figure 13:
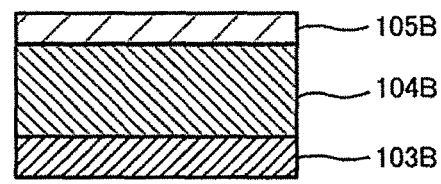

FIG. 13 is cross-sectional views showing configurations of Modified Examples of the nonvolatile memory element according to Embodiment 1 of the present invention.

Figure 14:
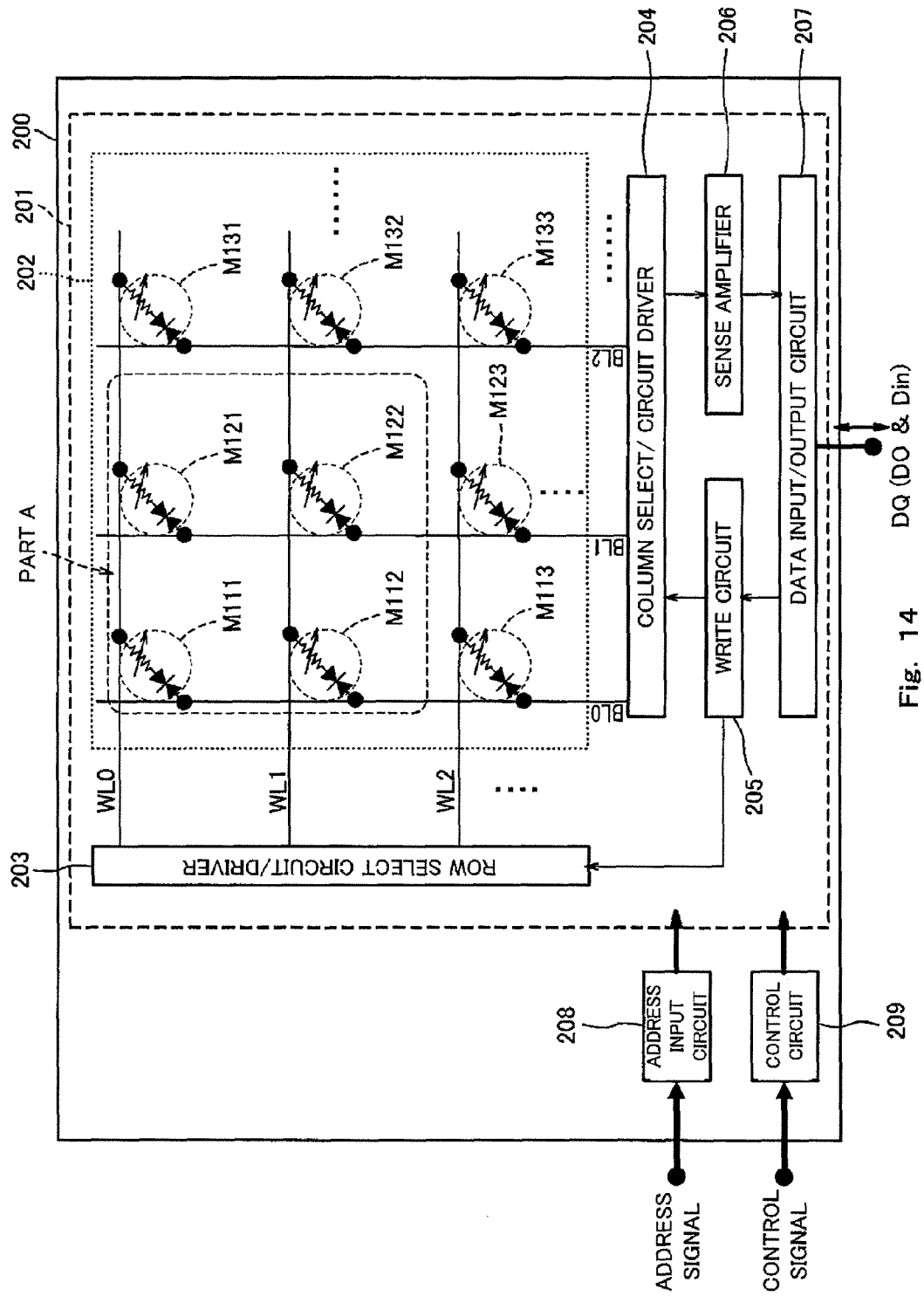

FIG. 14 is a block diagram showing a configuration of a nonvolatile memory device according to Embodiment 2 of the present invention.

Figure 15:
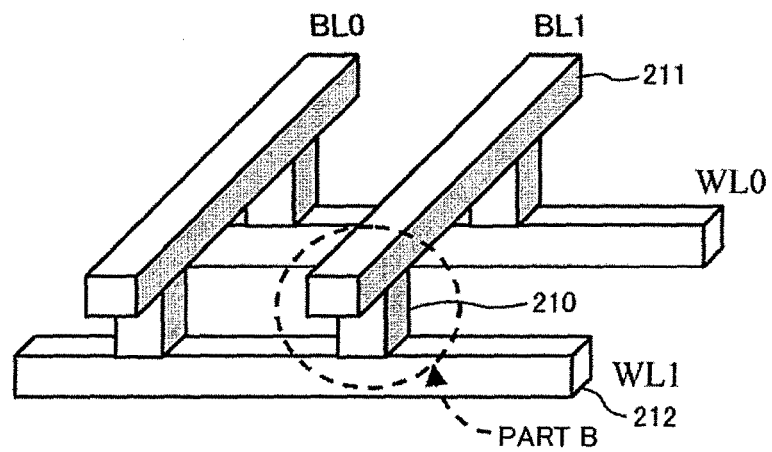

FIG. 15 is a perspective view showing a configuration (configuration corresponding to 4 bits) in part A of FIG. 13.

Figure 16:
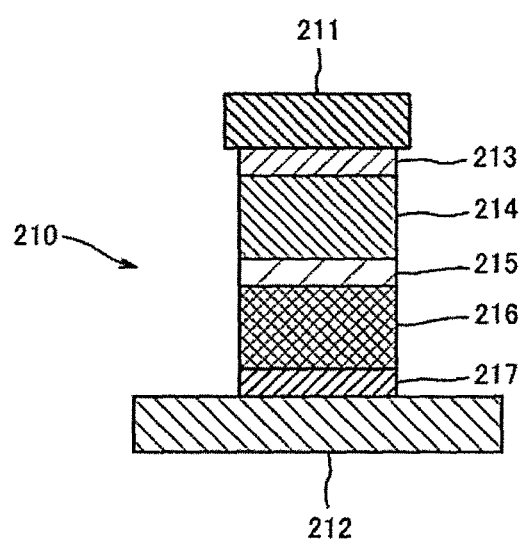

FIG. 16 is a cross-sectional view showing a configuration of a nonvolatile memory element included in a nonvolatile memory device according to Embodiment 2 of the present invention.

Figure 17:
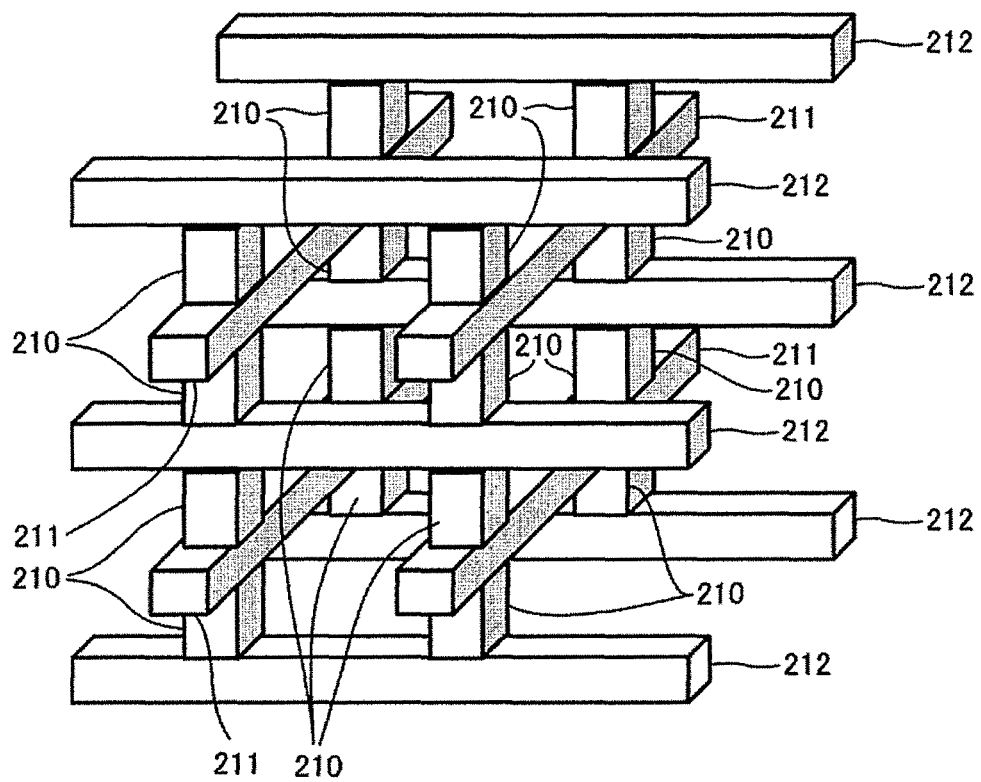

FIG. 17 is a perspective view showing a configuration of a memory array included in a nonvolatile memory device having a multi-layer structure of the present invention.

Figure 18:
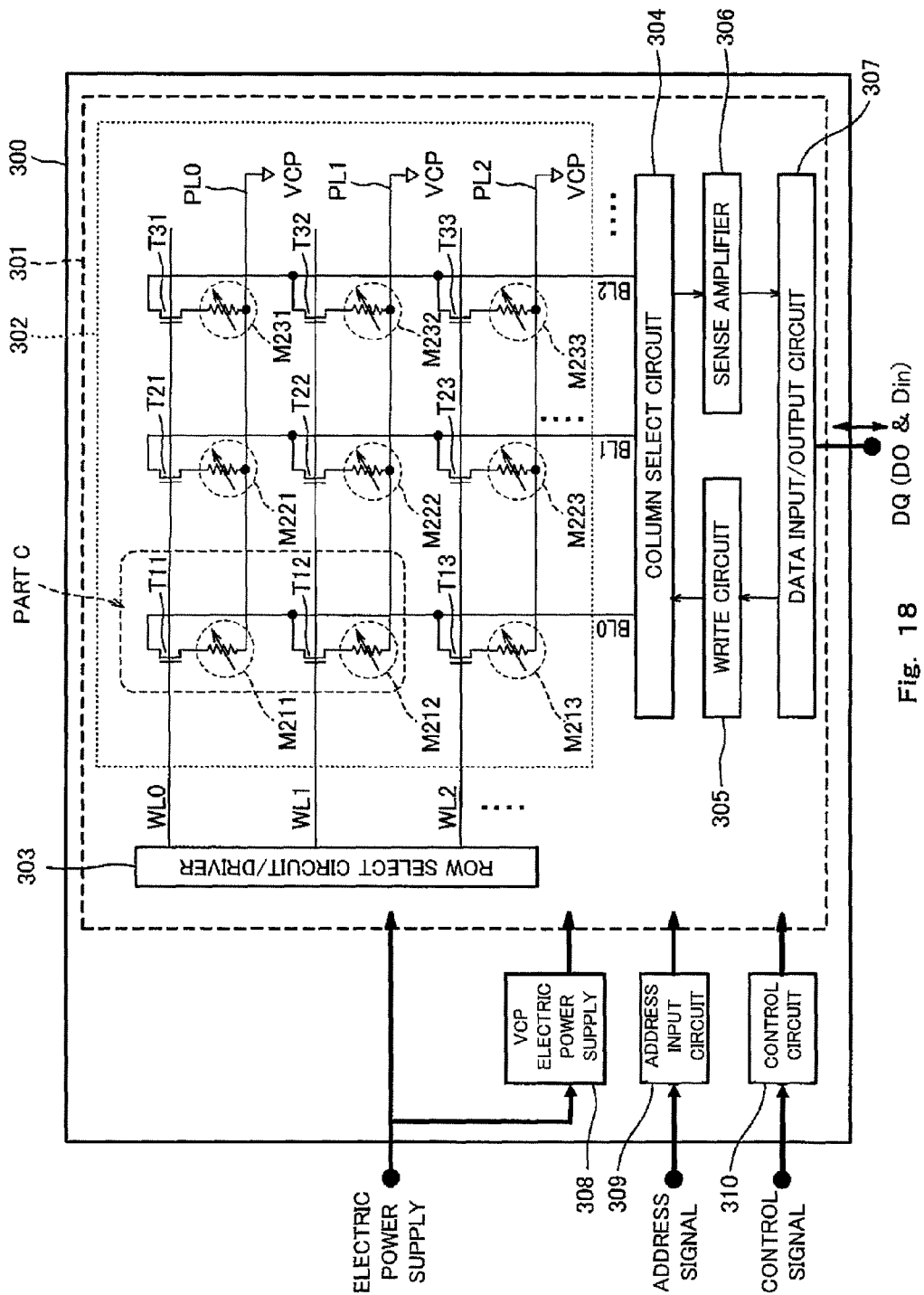

FIG. 18 is a block diagram showing a configuration of a nonvolatile memory device according to Embodiment 3 of the present invention.

Figure 19:
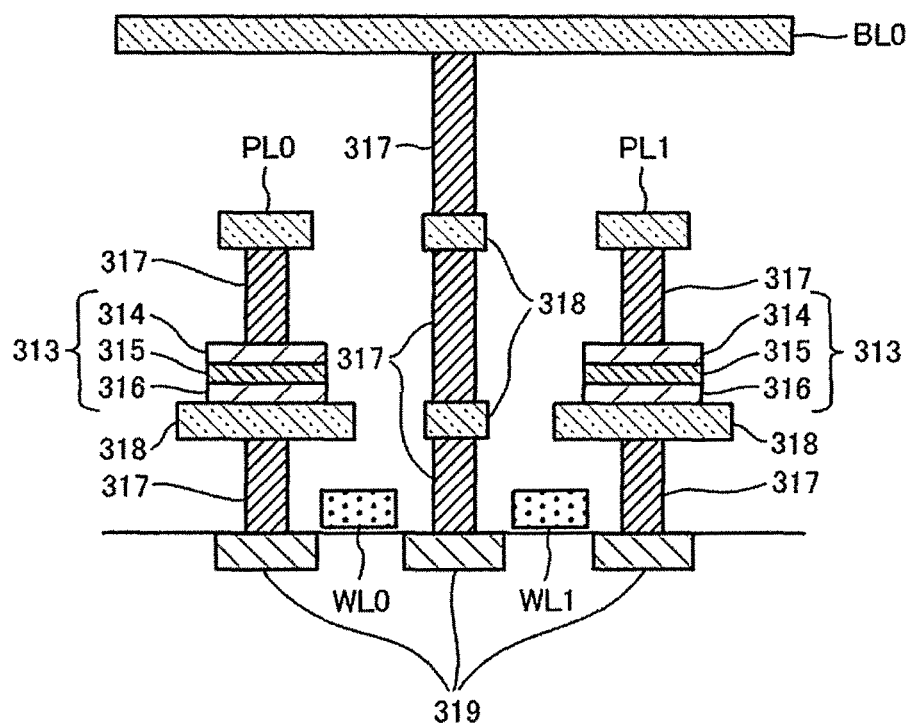

FIG. 19 is a cross-sectional view showing a configuration (configuration corresponding to 2 bits) in part C of FIG. 18.

Figure 20A:
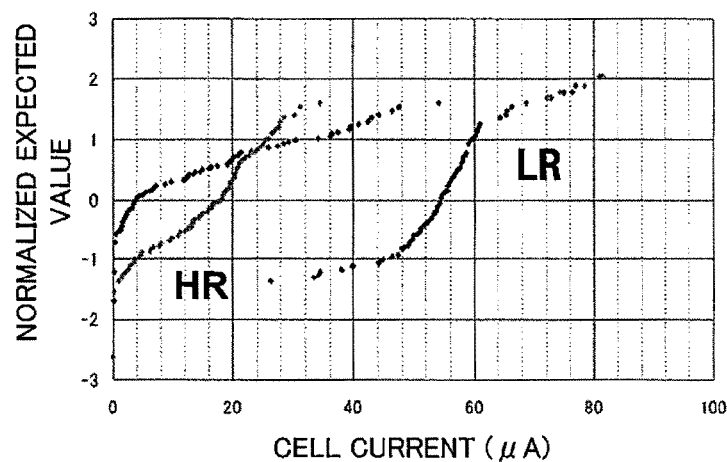

FIG. 20A is a view showing a relationship between a cell current value and a normalized expected value of a resistance value in the nonvolatile memory device according to Embodiment 3 of the present invention, and showing a case where a platinum content of a second electrode layer is 100 atm %.

Figure 20B:
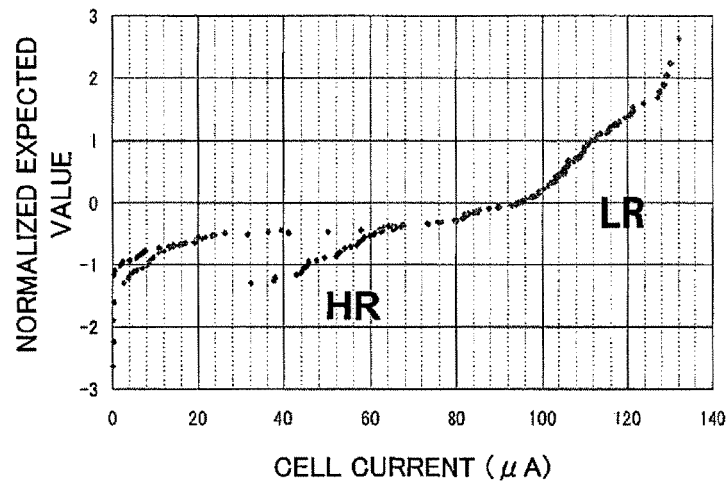

FIG. 20B is a view showing a relationship between the cell current value and the normalized expected value of the resistance value in the nonvolatile memory device according to Embodiment 3 of the present invention, and showing a case where the platinum content of the second electrode layer is 95 atm %.

Figure 20C:
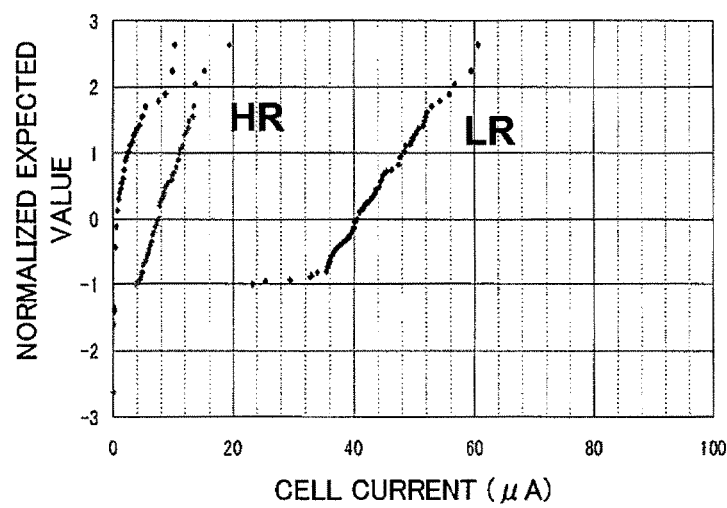

FIG. 20C is a view showing a relationship between the cell current value and the normalized expected value of the resistance value in the nonvolatile memory device according to Embodiment 3 of the present invention, and showing a case where the platinum content of the second electrode layer is 92 atm %.

Figure 20D:
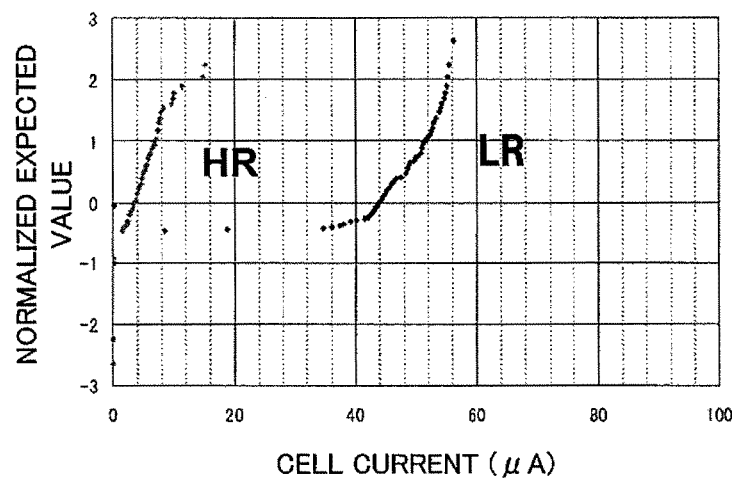

FIG. 20D is a view showing a relationship between the cell current value and the normalized expected value of the resistance value in the nonvolatile memory device according to Embodiment 3 of the present invention, and showing a case where the platinum content of the second electrode layer is 89 atm %.

Figure 20E:
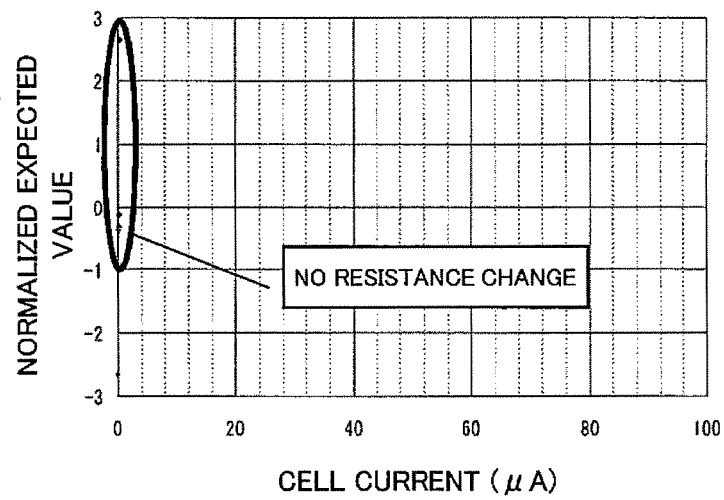

FIG. 20E is a view showing a relationship between the cell current value and the normalized expected value of the resistance value in the nonvolatile memory device according to Embodiment 3 of the present invention, and showing a case where the platinum content of the second electrode layer is 86 atm %.

Figure 21A:
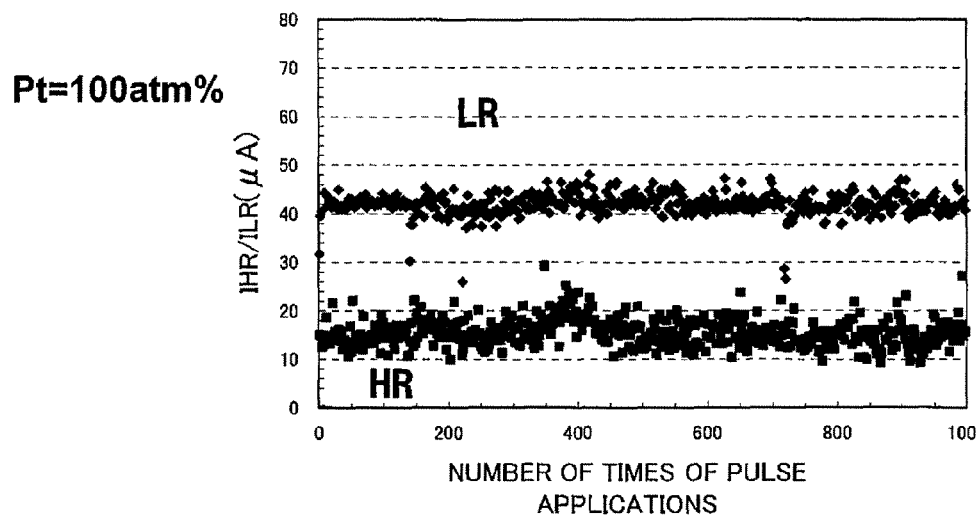

FIG. 21A is a view showing a relationship between the number of times pulses are applied and IHR/ILR ratio in the nonvolatile memory device according to Embodiment 3 of the present invention, and showing a case where the platinum content of the second electrode layer is 100 atm %.

Figure 21B:
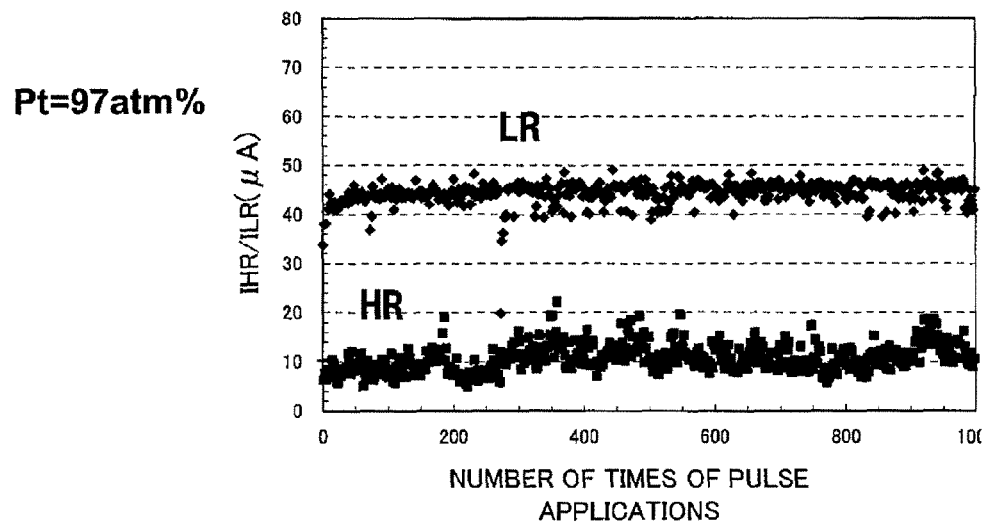

FIG. 21B is a view showing a relationship between the number of times pulses are applied and IHR and ILR in the nonvolatile memory device according to Embodiment 3 of the present invention, and showing a case where the platinum content of the second electrode layer is 97 atm %.

Figure 21C:
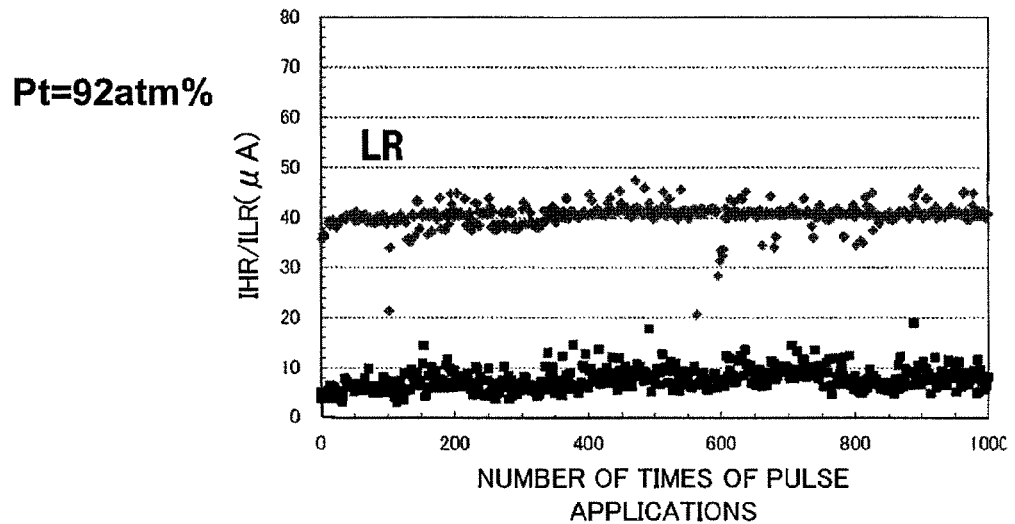

FIG. 21C is a view showing a relationship between the number of times pulses are applied and IHR and ILR in the nonvolatile memory device according to Embodiment 3 of the present invention, and showing a case where the platinum content of the second electrode layer is 92 atm %.

Figure 21D:
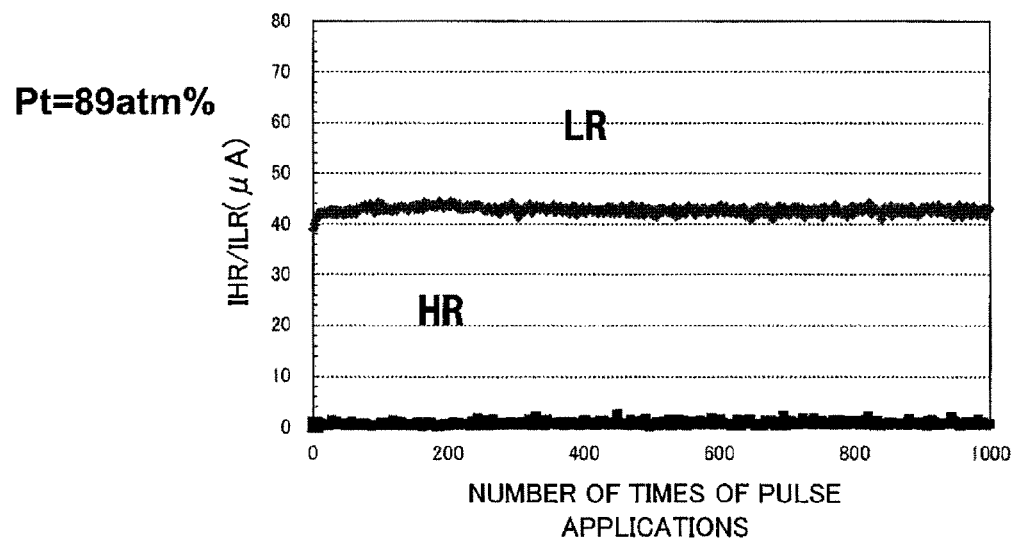

FIG. 21D is a view showing a relationship between the number of times pulses are applied and IHR and ILR in the nonvolatile memory device according to Embodiment 3 of the present invention, and showing a case where the platinum content of the second electrode layer is 89 atm %.

Figure 22A:
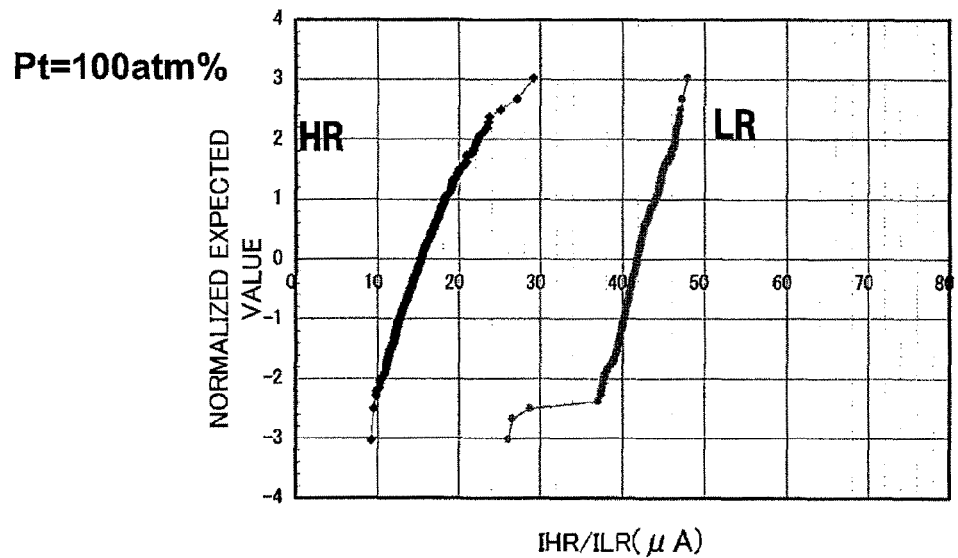

FIG. 22A is a view showing a relationship between IHR and ILR and the normalized expected value of the resistance value in the nonvolatile memory device according to Embodiment 3 of the present invention, and showing a case where the platinum content of the second electrode layer is 100 atm %.

Figure 22B:
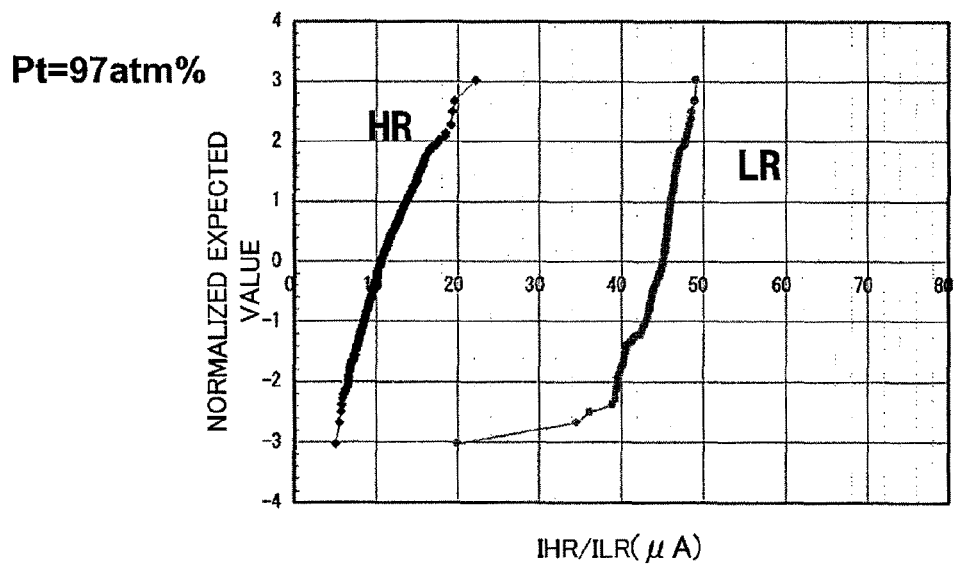

FIG. 22B is a view showing a relationship between IHR and ILR and the normalized expected value of the resistance value in the nonvolatile memory device according to Embodiment 3 of the present invention, and showing a case where the platinum content of the second electrode layer is 97 atm %.

Figure 22C:
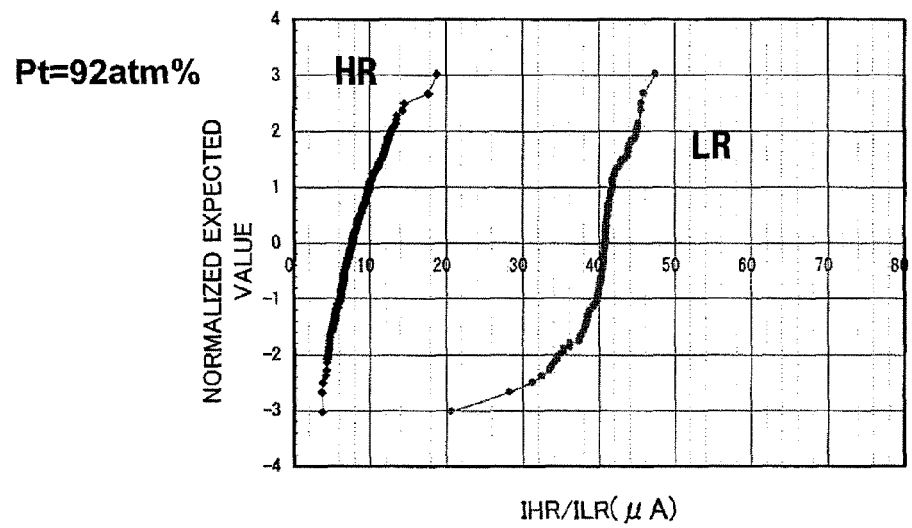

FIG. 22C is a view showing a relationship between IHR and ILR and the normalized expected value of the resistance value in the nonvolatile memory device according to Embodiment 3 of the present invention, and showing a case where the platinum content of the second electrode layer is 92 atm %.

Figure 22D:
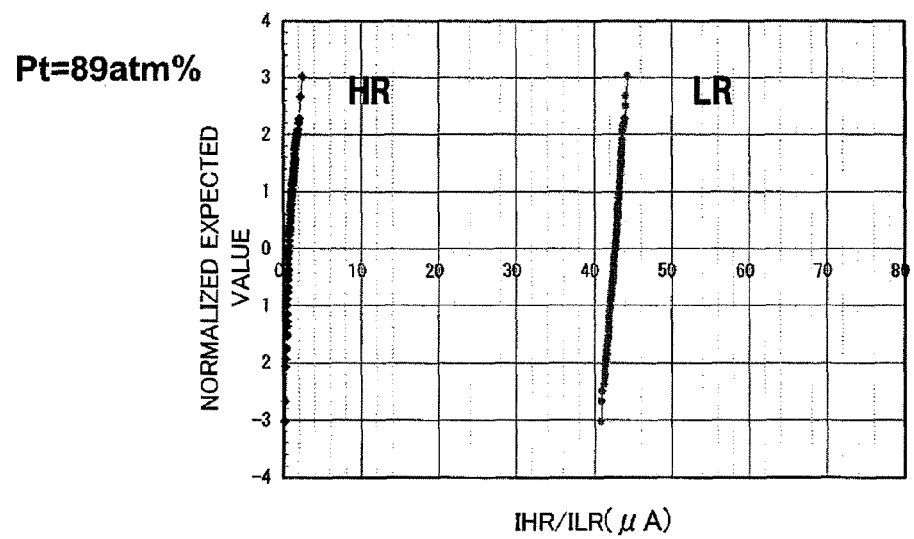

FIG. 22D is a view showing a relationship between IHR and ILR and the normalized expected value of the resistance value in the nonvolatile memory device according to Embodiment 3 of the present invention, and showing a case where the platinum content of the second electrode layer is 89 atm %.

Figure 23:
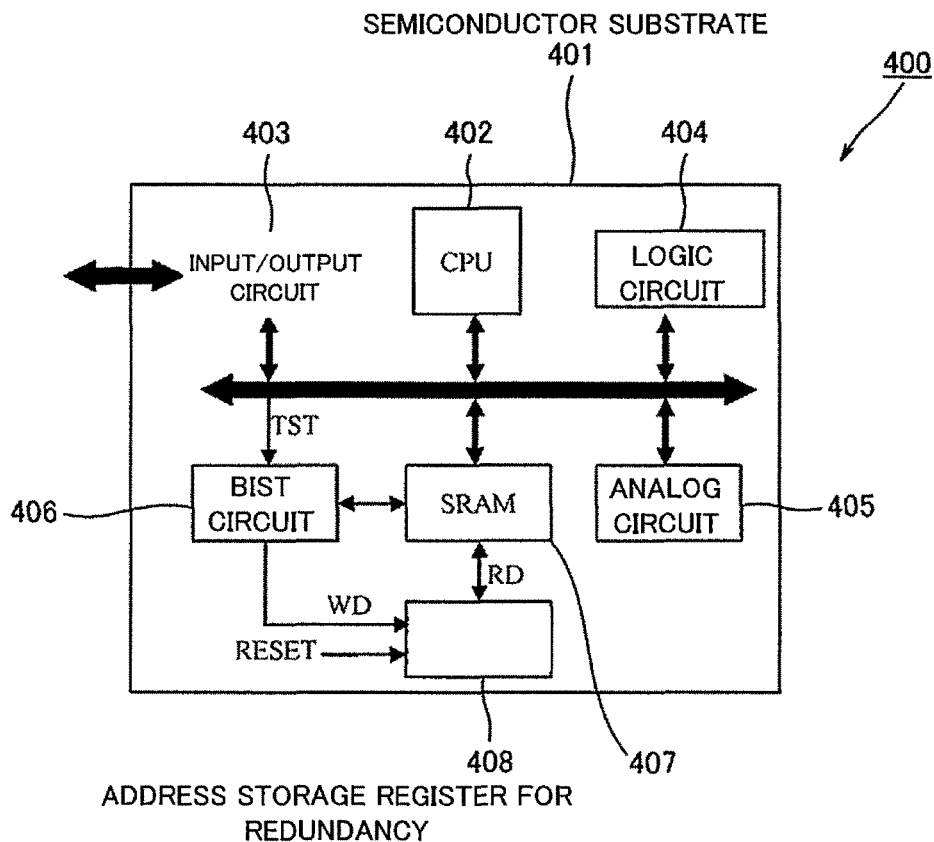

FIG. 23 is a block diagram showing a configuration of a nonvolatile semiconductor device according to Embodiment 4 of the present invention.

Figure 24:
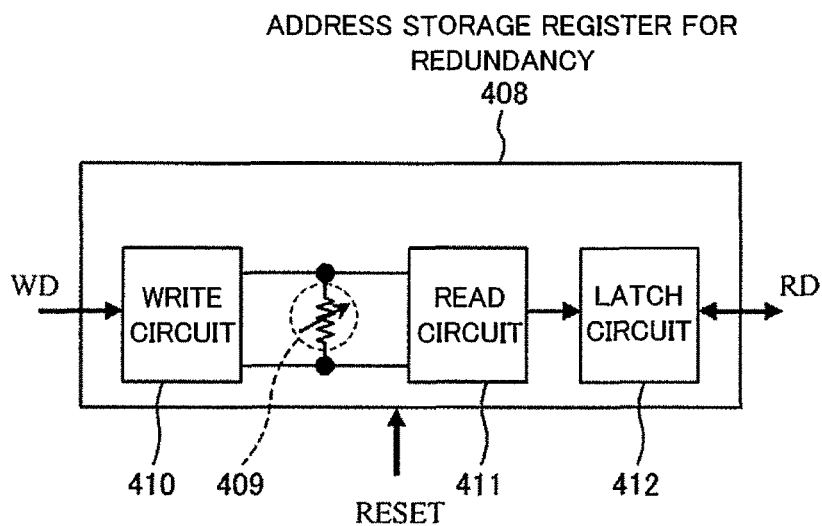

FIG. 24 is a block diagram showing a configuration of an address storage register for redundancy included in the nonvolatile semiconductor device according to Embodiment 4 of the present invention.

Figure 25:
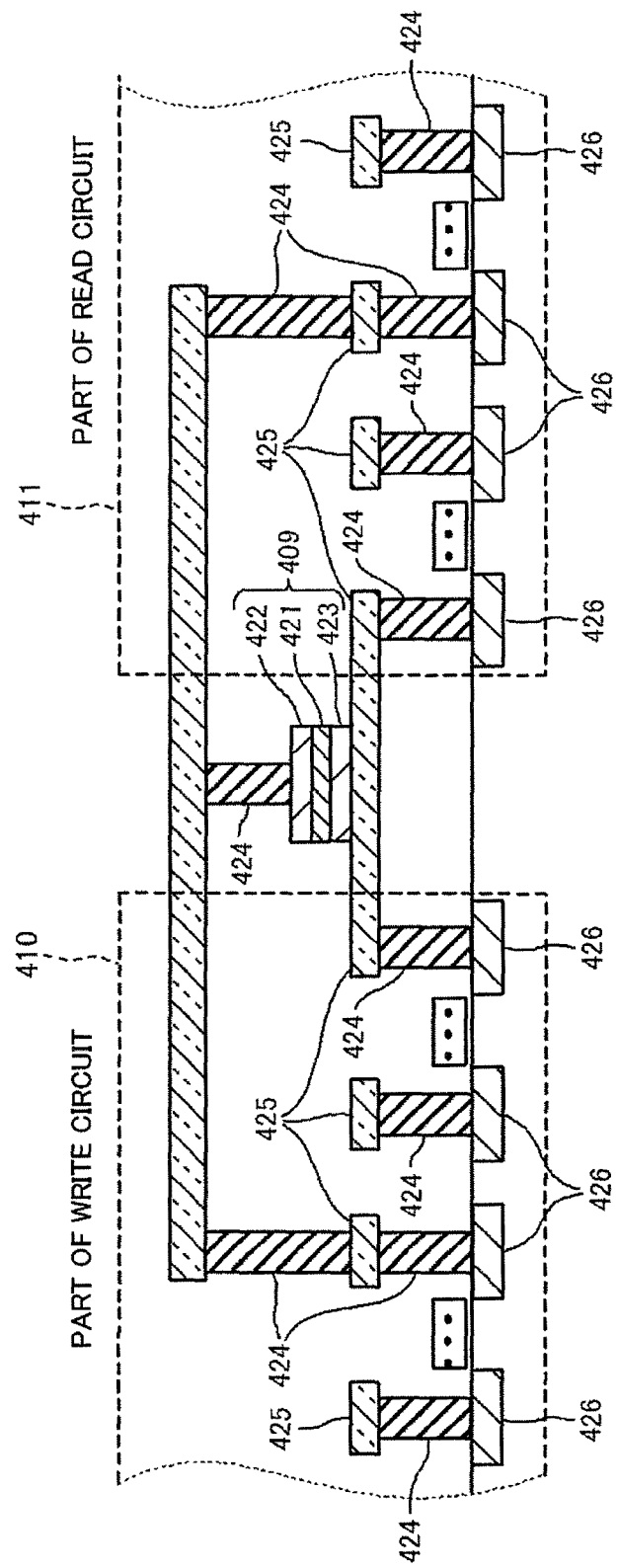

FIG. 25 is a cross-sectional view showing a configuration of the address storage register for redundancy included in the nonvolatile semiconductor device according to Embodiment 4 of the present invention.

Figure 26:
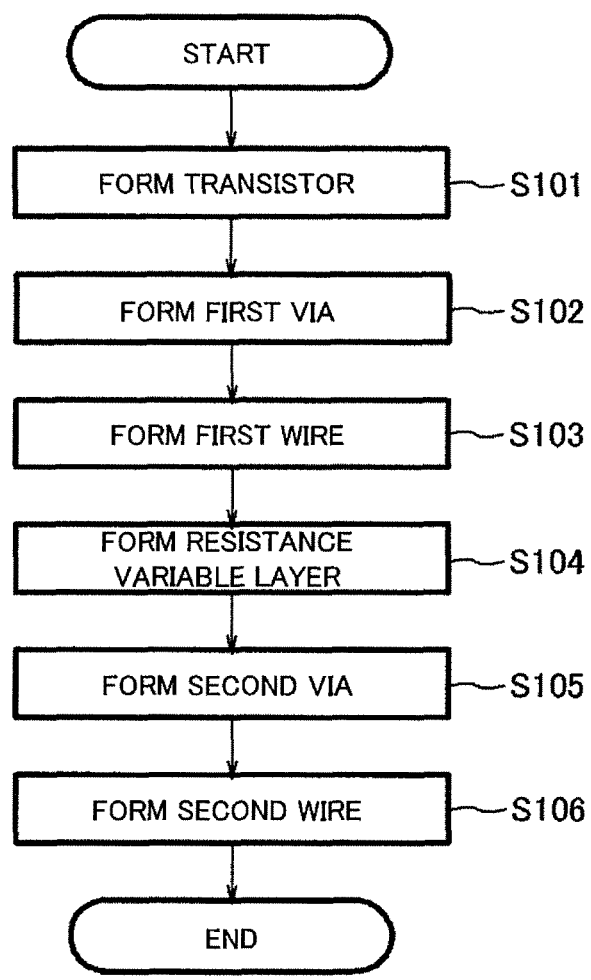

FIG. 26 is a flowchart showing a main flow of manufacturing process steps of the nonvolatile semiconductor device according to Embodiment 4 of the present invention.

DESCRIPTION OF EMBODIMENTS

Hereinafter, embodiments of the present invention will be described in detail with reference to the drawings. Throughout the drawings, the same reference numerals are assigned to the same or corresponding constituents and description thereof is omitted in some cases.

Embodiment 1

Configuration of Nonvolatile Memory Element

Figure 1:
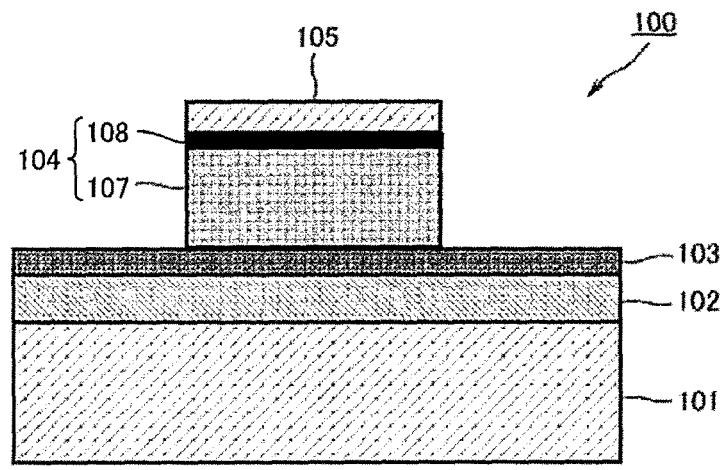
FIG. 1 is a cross-sectional view showing an exemplary configuration of a nonvolatile memory element according to Embodiment 1 of the present invention.

FIG. 1 is a cross-sectional view showing an exemplary configuration of an nonvolatile memory element according to Embodiment 1 of the present invention.

As shown in FIG. 1, a nonvolatile memory element 100 includes a substrate 101, an oxide layer 102 formed on the substrate 101, a first electrode layer 103 formed on the oxide layer 102, a second electrode layer 105, and a resistance variable layer 104 sandwiched between the first electrode layer 103 and the second electrode layer 105. In this embodiment, the resistance variable layer 104 is configured to include a low-degree oxidization layer 107 formed on the first electrode layer 103, and a high-degree oxidization layer 108 formed on the low-degree oxidization layer 107.

When the nonvolatile memory element 100 is driven, voltages (electric signals) satisfying predetermined conditions are applied between the first electrode layer 103 and the second electrode layer 105 by an external electric power supply. The resistance values of the resistance variable layer 104 of the nonvolatile memory element 100 increase or decrease according to the direction (polarities of the voltages) in which the voltages are applied. For example, when a pulse voltage larger than a predetermined threshold voltage is applied, the resistance value of the resistance variable layer 104 increases or decreases, whereas when a pulse voltage smaller than the threshold voltage is applied, the resistance value of the resistance variable layer 104 will not change.

At least one of the first electrode layer 103 and the second electrode layer 105 comprises platinum (platinum-Ta) including Ta. A material of an electrode which is not formed of a platinum material including Ta is not particularly limited. Hereinafter, an exemplary configuration in which the first electrode layer 103 comprises TaN and the second electrode layer 105 comprises platinum comprising Ta will be described.

The resistance variable layer 104 comprises tantalum oxide. The tantalum oxide satisfies 0<x<2.5 when the tantalum oxide is expressed as $TaO_x$. The reason why x falls within this range will be explained in detail later. In other words, this tantalum oxide is an oxygen-deficient tantalum oxide which is less in oxygen atom number than a stoichiometric composition. The low-degree oxidization layer 107 and the high-degree oxidization layer 108 are different from each other in oxygen content of the tantalum oxide in such a way that the oxygen content of the high-degree oxidization layer 108 is higher than the oxygen content of the low-degree oxidization layer 107. Alternatively, the high-degree oxidization layer 108 may be omitted, and the resistance variable layer 104 may be composed of a single tantalum oxide layer. In further alternative, the resistance variable layer 104 may include three or more tantalum oxide layers. In further alternative, the resistance variable layer 104 may be composed of a single tantalum oxide layer, and its oxygen content may have a profile in a thickness direction thereof.

As the substrate 101, a silicon monocrystalline substrate or a semiconductor substrate may be used, but the substrate 101 is not limited to these. Since the resistance variable layer 104 can be formed at a relatively low substrate temperature, it can be formed on a material such as resin.

[Manufacturing Method of Nonvolatile Memory Element]

The following will describe a manufacturing method of the nonvolatile memory element 100 of this embodiment.

Initially, over the substrate 101 which was a monocrystalline silicon, the oxide layer (insulating layer comprising $SiO_2$) 102 having a thickness of 200 nm was formed by thermal oxidation. A TaN layer having a thickness of 100 nm was formed over the oxide layer 102 as the first electrode layer 103.

Next, an oxygen-deficient tantalum oxide layer which was the resistance variable layer 104 was formed over the first electrode layer 103. The layer was deposited by reactive RF sputtering using a Ta target. The layer deposition conditions in the present case are shown in table 1.

Alternatively, the resistance variable layer 104 may be deposited by sputtering in which a reactive gas such as $O_2$ is not used, by using tantalum oxide as a target.

TABLE 1

| Target | Ta |
|---|---|
| Degree of vacuum (Pa) | 0.2~5 (Pa) |
| Substrate heating temperature (° C.) | 20~400 (° C.) |
| Sputtering gas | Ar + $O_2$ |
| $O_2$ flow ratio (%) | 0.1~10 (%) |
| RF-Power (W) | 150~300 (W) |
| thickness (nm) | 1~300 (nm) |

Then, the resistance variable layer 104 was oxidized to form at its uppermost layer, a $Ta_2O_5$ layer having a thickness of 2~12 nm, as the high-degree oxidization layer 108. In this way, the resistance variable layer 104 was formed to include the high-degree oxidization layer 108 at the uppermost layer, and the low-degree oxidization layer 107 which was a portion other than the uppermost layer. Although the Ta$_2$O$_5$ layer is illustrated as the high-degree oxidization layer 108 in this embodiment, it is needless to say that a layer which is higher in oxygen content than the low-degree oxidization layer 107 and is lower in oxygen content than Ta$_2$O$_5$ may be formed. Finally, over the resistance variable layer 104, a platinum layer including Ta and having 50 nm-thick was deposited by RF sputtering as the second electrode layer 105. It is clear that the present invention is effectively applicable to a structure in which only the first electrode layer is formed by the platinum layer including Ta or a structure in which both of the first electrode layer and the second electrode layer are formed by the platinum layer including Ta.

[Composition Control for Platinum-Ta Electrode Layer]

Figure 2:
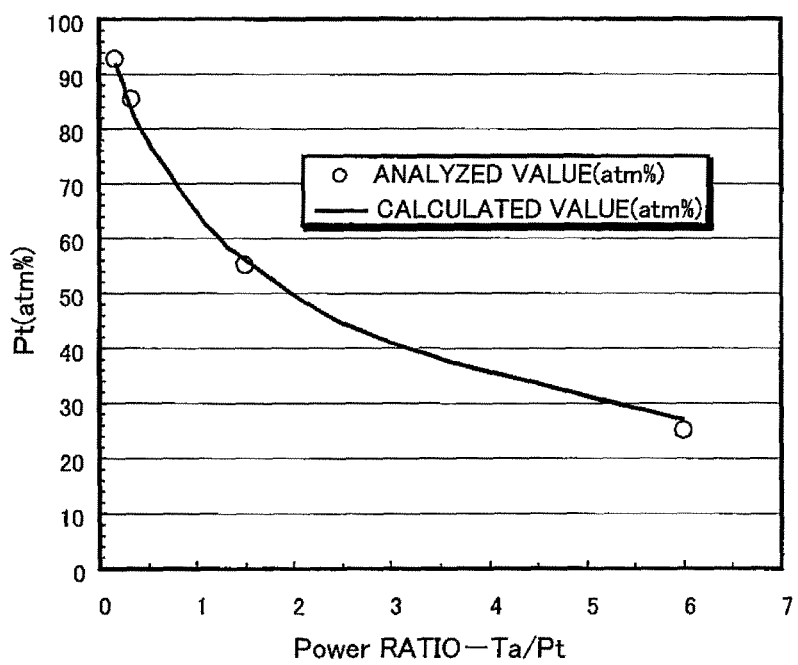
FIG. 2 is a view showing a relationship between a power application ratio (Ta/platinum) and a platinum content in a case where a platinum electrode including Ta is formed by cosputtering.

Now, a forming method of the platinum layer including Ta will be described. The platinum layer was deposited by DC-sputtering, in which cosputtering with platinum and Ta target was conducted. During the deposition, a degree of vacuum was set to 1.0 Pa, an application DC-power was set to 50~300W for each target, an Ar flow rate was set to 10 sccm, and deposition time was set to 20 minutes. Based on a relationship between the application power and the deposition speed corresponding to each single target, a content ratio in the cosputtering was calculated. FIG. 2 shows a relationship between a ratio between DC powers applied to the respective targets and the calculated platinum content (atm %). In addition, FIG. 2 shows analyzed content values. The composition analysis was conducted by a low energy X-ray analysis method. As can be clearly seen from FIG. 2, the calculated values coincided with the analyzed values very well. Therefore, the content ratio between platinum and Ta was able to be controlled by controlling the powers applied to the respective targets.

[Surface Characteristic of Platinum-Ta Electrode Layer]

The surface roughness of the platinum electrode layer (150 nm in thickness) including Ta was analyzed using an atomic force microscope (AFM). In this analysis, as the atomic force microscope, "Dimension 3100" manufactured by Digital Instruments Co., Ltd was used. Table 2 shows an analysis result. Average surface roughness Ra decreased as the platinum content decreased. The average surface roughness Ra is "calculated average roughness Ra" defined in JIS B 0601 (1994). The surface roughness of the layer comprising a single element of platinum was about 1.3 nm. However, in the layer having a platinum content of 92 atm % and a Ta content of 8 atm %, the surface roughness was 0.53 nm which was much smaller than and about 40% of about 1.3 nm. This was considered to be because migration of platinum was prevented.

TABLE 2

| Platinum content (atm %) | Ra (nm) |
| --- | --- |
| 27 | 0.24 |
| 41 | 0.14 |
| 56 | 0.12 |
| 65 | 0.32 |
| 76 | 0.27 |
| 83 | 0.29 |
| 89 | 0.37 |
| 92 | 0.53 |
| 100 | 1.32 |

[Initial Resistance Value of Nonvolatile Memory Element]

Figure 3A:
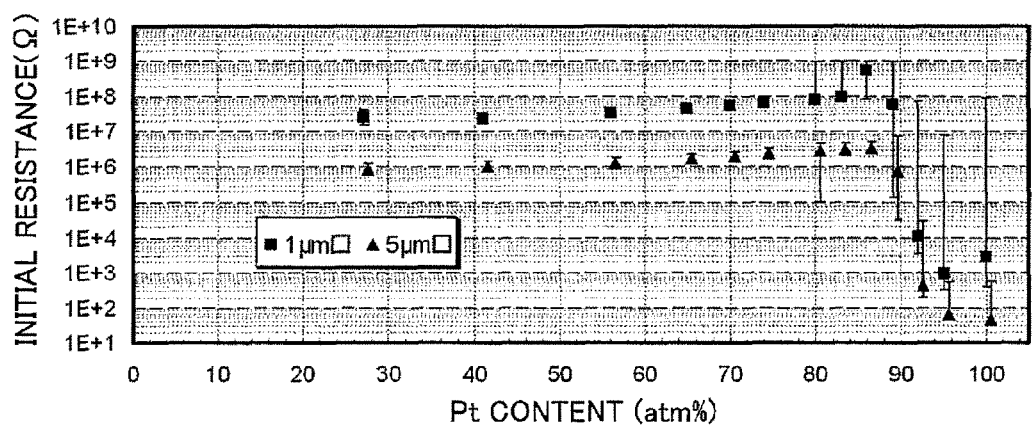
Figure 3B:
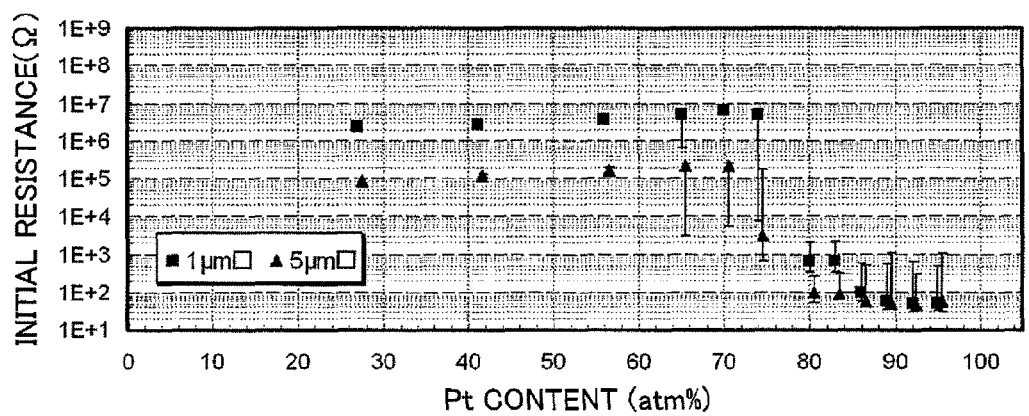

The following will describe the relationship between the initial resistance value of the nonvolatile memory element 100 of this embodiment and the platinum content of the second electrode layer 105, with reference to FIGS. 3A and 3B. FIGS. 3A and 313 depict the relationship between the initial resistance values of element sections of an electrode size of 1 μm square (1 μm$^2$) and of an electrode size of 5 μm square (5 μm$^2$) and the contents of platinum (Pt) of the second electrode layer 105. FIG. 3A shows a case where the thickness of the high-degree oxidization layer 108 is 8.0 nm, while FIG. 3B shows a case where the thickness of the high-degree oxidization layer 108 is 3.6 nm.

As shown in FIG. 3A, when the platinum content of the second electrode layer 105 was 89 atm % or less, the initial resistance values of the nonvolatile memory element 100 were relatively stable. When the platinum content of the second electrode layer 105 was less than 80 atm %, a variation in the resistance values was not substantially observed. On the other hand, when the platinum content of the second electrode layer 105 was not less than 89 atm %, the initial resistance value significantly decreased, and a variation in the resistance values increased, as the platinum content increased. When the initial resistance values corresponding to the electrode size of 1 μm$^2$ were compared, a difference in magnitude between a minimum initial resistance value and a maximum initial resistance value was 5-digit or more among the electrodes having a platinum content of 100%. In light of this, when the thickness of the high-degree oxidization layer 108 is 8.0 nm, it is desirable that the platinum content of the second electrode layer 105 be 89 atm % or less, to lessen a variation in the initial resistances of the element.

As shown in FIG. 3B, when the platinum content of the second electrode layer 105 was 74 atm % or less, the initial resistance values of the nonvolatile memory element 100 were relatively stable. On the other hand, when the platinum content of the second electrode layer 105 was not less than 80 atm %, the initial resistance value significantly decreased as the platinum content increased. In light of this, when the thickness of the high-degree oxidization layer 108 is 3.6 nm, it is desirable that the platinum content of the second electrode layer 105 be 74 atm % or less, to lessen a variation in the initial resistances of the nonvolatile memory element.

Figure 4:
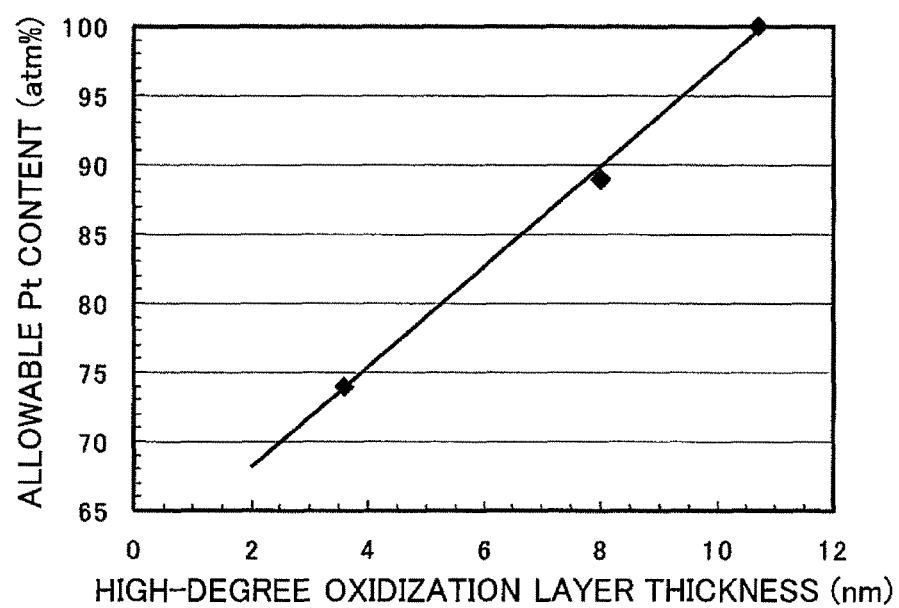
FIG. 4 is a view showing a relationship between a platinum content of an electrode layer with which a variation in initial resistance values is permissible, and a thickness of a high resistance layer 106.

From the results of FIGS. 3A and 3B, it was found that a proper platinum content of the second electrode layer 105 was different depending on the thickness of the high-degree oxidization layer 108. It was presumed that when the thickness of the high-degree oxidization layer 108 was smaller, the platinum hillocks affected more significantly, and the platinum content with which a variation in the initial resistance values was permissible decreased. FIG. 4 is a view showing a relationship between the allowable platinum content of the electrode layer 105 and the thickness of the high-degree oxidization layer 108. As can be seen from FIGS. 3A and 3B, when the thickness of the high-degree oxidization layer 108 was 8.0 nm, a variation in the initial resistances was less when the platinum content was 89% or less, while when the thickness of the high-degree oxidization layer 108 was 3.6 nm, a variation in the initial resistances was less when the platinum content was 74% or less. A plotted value corresponding to the platinum content of 100% in FIG. 4 indicated a measurement initial resistance value in a case where the thickness of the high-degree oxidization layer 108 was 10.6 nm, and a variation in the initial resistances was less when the thickness of the high-degree oxidization layer 108 was 10.6 nm. As can be clearly seen from FIG. 4, there was a substantially proportional relationship between these data. On the other hand, because a naturally oxidized layer was formed at the uppermost layer of the resistance variable layer 104, it was difficult to form the high-degree oxidization layer 108 with a thickness less than 2 nm. From the above results, when the thickness of the high-degree oxidization layer 108 is expressed as Y(nm), the platinum content Z(atm %) with which a variation in the initial resistance values is permissible, is expressed as a formula of Z=3.65Y+60.7.

When the thickness of the high-degree oxidization layer 108 was not less than 12 nm, it had high insulativity, and a resistance changing phenomenon of the element was not observed because of an insufficient drivability of a transistor connected to the element.

[Exemplary Operation of Nonvolatile Memory Element]

The following will describe an exemplary operation of the nonvolatile memory element 100 according to this embodiment as a memory, i.e., an example of the operation which occurs when writing/reading data, with reference to the drawings.

Figure 5:
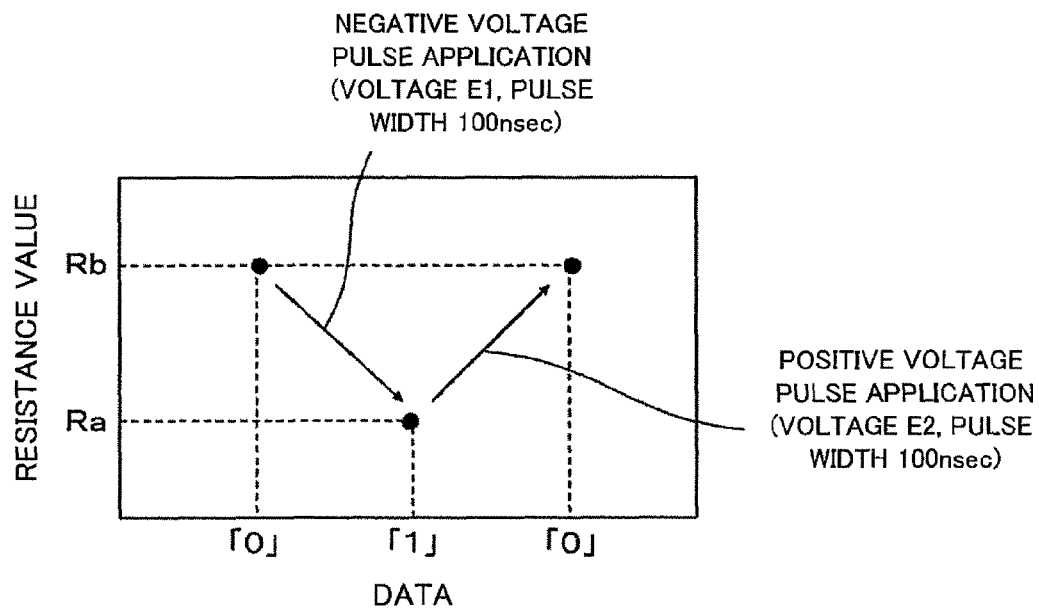
FIG. 5 is a view showing an exemplary operation of the nonvolatile memory element according to Embodiment 1 of the present invention, in a case where data is written.

FIG. 5 is a view showing an exemplary operation of the nonvolatile memory element 100 according to Embodiment 1 of the present invention, which occurs when writing data.

When two kinds of electric pulses having different polarities and a pulse width of 100 nsec are applied alternately between the first electrode layer 103 and the second electrode layer 105 (hereinafter sometimes expressed as between the electrodes), the resistance values of the resistance variable layer 104 change as shown in FIG. 3. To be specific, when a negative voltage pulse (voltage E1, pulse width 100 nsec) is applied between the electrodes, the resistance value of the resistance variable layer 104 decreases from a high-resistance value Rb to a low-resistance value Ra. On the other hand, when a positive voltage pulse (voltage E2, pulse width 100 nsec) is applied between the electrodes, the resistance value of the resistance variable layer 104 increases from the low-resistance value Ra to the high-resistance value Rb. In this embodiment, a voltage pulse with which the electric potential of the second electrode layer 105 is higher relative to the electric potential of the first electrode layer 103 is referred to as a positive voltage pulse, while a voltage pulse with which the electric potential of the second electrode layer 105 is lower relative to the electric potential of the first electrode layer 103 is referred to as a negative voltage pulse. In this case, the voltage E1 is −3.0V and the voltage E2 is +3.5V.

In the example shown in FIG. 5, the high-resistance value Rb is allocated to data "0" and the low-resistance value Ra is allocated to data "1." Therefore, the data "0" is written by applying the positive voltage pulse between the electrodes so that the resistance value of the resistance variable layer 104 reaches the high-resistance value Rb, while the data "1" is written by applying the negative voltage pulse between the electrodes so that the resistance value reaches the low-resistance value Ra.

Figure 6:
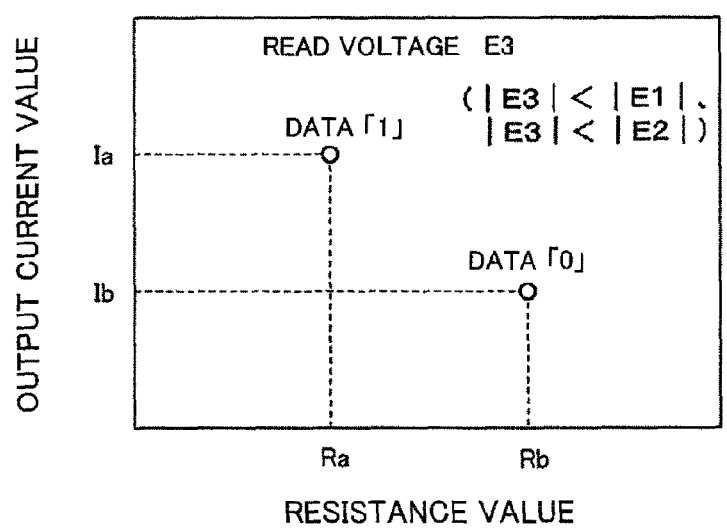
FIG. 6 is a view showing an exemplary operation of the nonvolatile memory element according to Embodiment 1 of the present invention, in a case where data is read.

FIG. 6 is a view showing an exemplary operation of the nonvolatile memory element according to Embodiment 1 of the present invention, which occurs when reading data.

When reading data, a read voltage E3 (|E3|<|E1|, |E3|<|E2|) which has a smaller amplitude than the electric pulse applied to change the resistance value of the resistance variable layer 104 is applied between the electrodes. As a result, a current corresponding to the resistance value of the resistance variable layer 104 is output, and its output current value is detected, thereby enabling reading of the written data.

In the example illustrated in FIG. 6, since an output current value 1a corresponds to the resistance value Ra and an output current value 1b corresponds to the resistance value Rb, the data "1" is read when the output current value 1a is detected, while the data "0" is read when the output current value 1b is detected.

Since a region of the resistance variable layer 104 which is sandwiched between the first electrode layer 103 and the second electrode layer 105 serves as a memory section in the manner described above, the nonvolatile memory element 100 operates as a memory.

[Resistance Changing Characteristic of Nonvolatile Memory Element]

The following will describe the resistance changing characteristic in a case where electric pulses are applied to the nonvolatile memory element 100 according to this embodiment.

Figure 7:
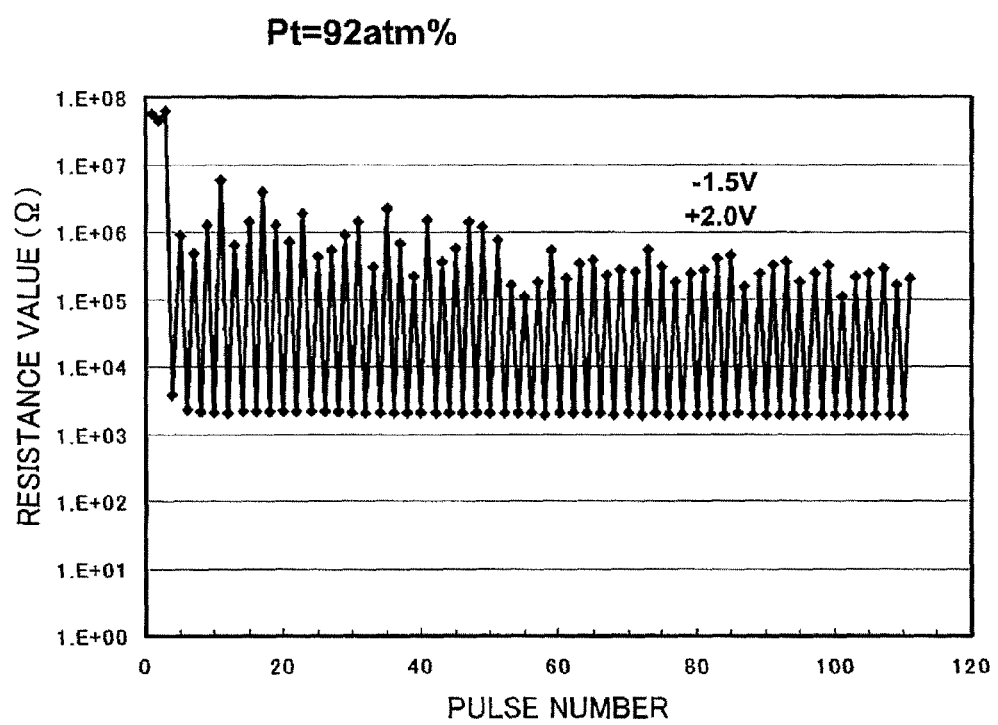
FIG. 7 is a view showing a relationship between a resistance value of a resistance variable layer included in the nonvolatile memory element according to Embodiment 1 of the present invention, and the number of times pulses are applied, and showing a relationship in a case where a platinum content of the second electrode layer is 92 atm %.

FIG. 7 is a view showing a relationship between the resistance value of the resistance variable layer 104 included in the nonvolatile memory element according to Embodiment 1 of the present invention, and the number of times pulses are applied. The material constituting the second electrode layer 105 has a platinum content of 92 atm % and a Ta content of 8 atm %. FIG. 7 shows a result obtained by applying two kinds of electric pulses having different polarities and a pulse width of 100 nsec alternately between the first electrode layer 103 and the second electrode layer 105.

By applying the two kinds of electric pulses alternately between the electrodes as described above, the resistance values of the resistance variable layer 104 changed reversibly as shown in FIG. 7. To be specific, when a negative voltage pulse (voltage 1.5V, pulse width 100 nsec) was applied between the electrodes, the resistance value of the resistance variable layer 104 decreased to 2000Ω (low-resistance value), while when a positive voltage pulse (voltage +2.0V, pulse width 100 nsec) was applied between the electrodes, the resistance value of the resistance variable layer 104 increased up to 200000Ω (high-resistance value). A voltage pulse with which the electric potential of the second electrode layer 105 is higher relative to the electric potential of the first electrode layer 103 is referred to as a positive voltage pulse, while a voltage pulse with which the electric potential of the second electrode layer 105 is lower relative to the electric potential of the first electrode layer 103 is referred to as a negative voltage pulse. It is supposed that definition of the positive and negative polarities is the same hereinafter.

The result shown in FIG. 7 corresponds to the resistance variable layer 104 which has a thickness of 25 nm and a circular pattern with a diameter of 2 μm. Hereinafter, it is supposed that the resistance variable layer 104 has the above size, unless otherwise explicitly noted.

FIGS. 8A to 8G are views each showing a relationship between the resistance value of the resistance variable layer 104 included in the nonvolatile memory element and the number of times pulses are applied, in a case where the platinum contents of the materials constituting the second electrode layer 105 are different from each other.

FIGS. 8A, 8B, 8C, 8D, 8E, 8F, and 8G show a relationship between the resistance value of the resistance variable layer 104 included in the nonvolatile memory element and the number of times pulses are applied, in a case where the platinum contents of the materials constituting the second electrode layer 105 are 27 atm %, 70 atm %, 86 atm %, 89 atm %, 92 atm %, 95 atm % and 100 atm %, respectively.

As can be seen from FIGS. 8A to 8G, for all of the above platinum contents of the materials constituting the second electrode layer, the resistance changing phenomenon was observed. Therefore, it was found out that the resistance variable layer 104 exhibited resistance change in correspondence with a wide content range of platinum in the electrode layer formed of a platinum layer comprising Ta. As the platinum content decreased, a voltage value required to allow resistance change to occur increased. In the platinum content of 27 atm %, a voltage of −3.5V/+4.0V was required. Therefore, it was presumed that there was a lower limit range of the platinum content to attain a good resistance changing characteristic at low voltages.

[Interface State of Platinum-Ta Electrode Layer]

The state of the interface between the second electrode layer 105 and the resistance variable layer 104 was observed by the transmission electron microscope (TEM). FIG. 9 shows the results. In a case where the second electrode layer 105 was made of a single element of platinum, concave-convex portions were observed at the interface of the tantalum oxide between the second electrode layer 105 and the resistance variable layer 104. The concave-convex portions resulted from the migration of platinum. The concave-convex portions projected into the tantalum oxide to a depth of 2~5 nm (FIG. 9A). In a case where the platinum content of the second electrode layer 105 was 92 atm %, the number of hillocks projecting from the second electrode layer 105 to the tantalum oxide decreased and the concave-convex portions had a depth decreased to about 3 nm (FIG. 9B), although this was within a view of the TEM observation. In contrast, in a case where the platinum content of the second electrode layer 105 was 83 atm %, the migration of platinum was not substantially observed (FIG. 9C). From the result of the TEM observation, it was verified that the degree to which platinum migrated was lessened as the platinum content of the second electrode layer 105 decreased. This result was consistent with the result as to how the surface roughness Ra measured by AFM depended on the platinum content. It was presumed that the resistance changing phenomenon was affected by the occurrence/non-occurrence of the migration.

FIGS. 10A to 10C are model views showing how platinum migrates in the nonvolatile memory element according to Embodiment 1 of the present invention. Although in these models, the Ta$_2$O$_5$ layers are illustrated as the high-degree oxidization layers, they are merely exemplary. Any layer may be used as the high-degree oxidization layer so long it has a higher oxygen content than a tantalum oxide layer (TaO$_x$ layer) as a low-degree oxidization layer, and achieves the same advantages as those of the models described below. As can be seen from FIGS. 10A to 10C, as the platinum content of the second electrode layer 105 is higher, the projections (concave-convex portions) resulting from the migration of platinum extend to the tantalum oxide layer (FIG. 10A). An electric field concentrates on the projections resulting from the migration. As a result, a redox occurs at a lower voltage as compared to an interface state at which the migration of platinum does not occur, thereby enabling the resistance changing phenomenon to occur.

It is considered that, if the thickness of the projections resulting from the migration is large (depth of the concave-convex portions is large), the platinum projections resulting from the migration grow to the inner tantalum oxide (TaO$_x$) layer with a lower resistivity through the Ta$_2$O$_5$ layer with a higher resistivity which is formed at the uppermost layer (FIG. 10B). Therefore, it is presumed that, as compared to a case where the projections resulting from the migration reached only the Ta$_2$O$_5$ layer (FIG. 10C), the resistance changing phenomenon occurs at a lower voltage in the case where the thickness of the projections resulting from the migration is large. When the platinum content of the second electrode layer 105 is not less than 83 atm % and not more than 92 atm %, a voltage of −2.0V/+3.0V is needed. However, it is considered that when the platinum content of the second electrode layer 105 is not less than 92 atm %, the resistance changing operation occurs at a smaller voltage which is −1.5/+2.0V because of an effect of the projections resulting from the migration.

[Standard Electrode Potential of Nonvolatile Memory Element]

From the above study, it is presumed that the resistance changing phenomenon is attributed to the redox of the tantalum oxide constituting the high-degree oxidization layer present in the vicinity of the interface with the electrode layer as expressed by a (formula 1):

$$2TaO_2 + O^{2-} \rightarrow Ta_2O_5 + 2e$$ (formula 1)

When a negative voltage is applied to the electrode, electrons are injected and thereby a reduction reaction progresses, thereby forming a state where TaO$_2$ is present at an uppermost layer of the resistance variable layer. This could result in a low-resistance state. On the other hand, when a positive voltage is applied to the electrode, oxygen ions migrate and thereby an oxidization reaction progresses, thereby forming a state where Ta$_2$O$_5$ is present at the uppermost layer of the resistance variable layer. This could result in a high-resistance state. To allow the redox expressed as the (formula 1) to progress efficiently, it is necessary that the standard electrode potential of material of the adjacent electrode layer be higher than the standard electrode potential of at least Ta. The standard electrode potential of Ta and the standard electrode potential of platinum are −0.6V and 1.19V, respectively. Thus, there is an electric potential difference of 1(V) or more, which could enable the reaction of the formula (1) to progress efficiently.

It is considered that, to allow for the resistance changing phenomenon which is equivalent to or superior to the resistance changing phenomenon occurring in the case where the platinum electrode is used, it becomes necessary to use an electrode material having a standard electrode potential equal to or higher than that of platinum. Accordingly, the standard electrode potential of the platinum layer comprising Ta was measured. The measurement result is shown in FIG. 11. When the platinum content was not less than 56 atm %, the standard electrode potential was not less than 0.97V and was substantially constant. This value was substantially equal to a measurement value of an electrode layer made of a single element of platinum. From this, it is expected that the resistance changing phenomenon which is equivalent to the resistance changing phenomenon occurring in the case where the electrode layer made of a single element of platinum, occurs, if the platinum content is not less than 56 atm %.

It should be noted that the electrode material which is equivalent in standard electrode potential to platinum is not limited to only platinum including Ta as illustrated in the present Example. A platinum material including metal being higher in standard electrode potential than Ta is predicted as having a standard electrode potential equivalent to that of platinum, and an electrode layer comprising such a platinum material is effectively used in the present invention.

[Range of Platinum Content]

Judging from the above results of the resistance changing characteristic of the resistance variable element, it is desirable that the platinum including Ta as the electrode material have a content which is at least not less than 56 atm %. In other words, it is considered that the lower limit value of the platinum content be not less than 56 atm % because the corresponding standard electrode potential is equal to the standard electrode potential of the single element of Pt. In contrast, the upper limit value of the platinum content is determined based on the relationship between the allowable platinum content of the electrode layer and the thickness of the high resistance layer 106, as shown in FIG. 4. When the thickness of the high resistance layer is Y(nm), the upper limit value of the platinum content Z(atm %) with which a variation in initial resistance values is permissible, is expressed as Z=3.65Y+60.7.

[Adhesivity to Insulator]

There conventionally exists a problem that when the platinum layer is used as the electrode layer, a void is generated because of a low adhesivity between a SiO$_2$ layer which is an insulating layer (interlayer insulating layer) and the second electrode layer. In contrast, in the nonvolatile memory element 100 of this embodiment, the platinum layer including Ta is used as the second electrode layer. Because of this, it is expected that adhesivity with the SiO$_2$ layer as the insulating layer is improved. The adhesivity between the insulating layer and the electrode layer was confirmed using an element including a patterned electrode layer/resistance variable layer and an insulative material. FIG. 12 shows an observation result of the cross-sectional SEM (scanning electron microscope). From the cross-sectional SEM image, any void did not appear between the platinum layer and the insulating layer, and therefore, improvement of the adhesivity was confirmed. Two white lines extending from the surface of the PT-Ta (platinum-Ta) electrode layer to the surface of the insulating layer indicate a contact hole (to be precise, cross section of its inner peripheral surface).

In this embodiment, as shown in FIG. 1, the resistance variable layer 104 is sandwiched between the first electrode layer 103 located at a lower side and the second electrode layer 105 located at an upper side, and both end portions of the resistance variable later 104 conform to both end portions of the second electrode layer 105. This is merely exemplary and the present invention is not limited to such a configuration.

Figure 13C:
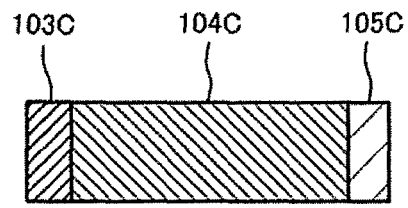

FIGS. 13A to 13C are cross-sectional views showing configurations of Modified Examples of the nonvolatile memory element according to Embodiment 1 of the present invention. In FIGS. 13A to 13C, a substrate and an oxide layer are omitted for the sake convenience.

In the Modified Example of FIG. 13A, a first electrode layer 103A, a resistance variable layer 104A and a second electrode layer 105A are stacked in this order, and both end portions of the first electrode layer 103A, the resistance variable layer 104A and the second electrode layer 105A do not conform to each other, in a cross-sectional view. In contrast, in the Modified Example of FIG. 13B, a first electrode layer 10313, a resistance variable layer 104B and a second electrode layer 105B are stacked in this order, and both end portions of the first electrode layer 103B, the resistance variable layer 104B and the second electrode layer 105B conform to each other, in a cross-sectional view. The nonvolatile memory element of the present invention may be configured in this way.

Although in the nonvolatile memory element 100 of this embodiment and the above two Modified Examples, the resistance variable layer is sandwiched between the upper and lower electrodes, electrodes may be formed on both end surfaces of the resistance variable layer to allow a current to flow in a direction parallel to a main surface of the resistance variable layer. To be specific, as shown in FIG. 13C, a first electrode 103C may be formed on one end surface of a resistance variable layer 104C and a second electrode 105C may be formed on the other end surface of the resistance variable layer 104C to allow a current to flow in a direction parallel to the main surface of the resistance variable layer 104C.

Although not shown, the nonvolatile memory element of this embodiment includes an insulating layer (interlayer insulating layer). A fluorine-doped oxide layer may be deposited by CVD or the like, and may be used as the insulating layer. Alternatively, the insulating layer may be omitted.

Likewise, although not shown, the nonvolatile memory element of this embodiment includes a wire layer. As a wire material, for example, Al, W, Cu, or the like may be used. Alternatively, the wire layer may be omitted.

When the resistance variable layer 104 is expressed as TaO$_x$, $0<x\leq1.9$ is preferably satisfied. More preferably, $0.5\leq x\leq1.9$ is satisfied. Most preferably, $0.8\leq x\leq1.9$ is satisfied to implement a stable resistance changing operation.

In a case where the resistance variable layer 104 is configured to have a structure in which a low-degree oxidization layer and a high-degree oxidization layer are stacked together, it is preferable that $0<x<2.5$ and $x<y\leq2.5$ are satisfied, when the low-degree oxidization layer 107 is expressed as TaO$_x$ and the high-degree oxidization layer 108 is expressed as TaO$_y$. More preferably, $0.8\leq x\leq1.9$ and $2.1\leq y\leq2.5$ are satisfied to implement a stable resistance changing operation.

Embodiment 2

The above described nonvolatile memory element according to Embodiment 1 is applicable to nonvolatile semiconductor devices having various configurations. A semiconductor device according to Embodiment 2 is a nonvolatile memory device which includes the nonvolatile memory element according to Embodiment 1 and is so-called a cross-point memory device in which an active layer intervenes at an intersection (three-dimensional cross point) between a word line and a bit line.

[Configuration of Semiconductor Device According to Embodiment 2]

FIG. 14 is a block diagram showing a configuration of a nonvolatile memory device according to Embodiment 2 of the present invention. FIG. 15 is a perspective view showing a configuration (configuration corresponding to 4 bits) in part A of FIG. 14.

As shown in FIG. 14, a nonvolatile memory device 200 according to this embodiment includes a memory main section 201 on a semiconductor substrate. The memory main section 201 includes a memory array 202, a row select circuit/driver 203, a column select circuit/driver 204, a write circuit 205 for writing data, a sense amplifier 206 which detects an amount of a current flowing in a selected bit line and determines the data as "1" or "0," and a data input/output circuit 207 which executes input/output processing of input/output data via a terminal DQ. The nonvolatile memory device 200 further includes an address input circuit 208 which receives address signals externally input, and a control circuit 209 for controlling the operation of the memory main section 201, based on a control signal externally input.

As shown in FIGS. 14 and 15, the memory array 202 includes a plurality of word lines WL0, WL1, WL2, ... which are formed on the semiconductor substrate to extend in parallel with each other, and a plurality of bit lines BL0, BL1, BL2, ... which are formed above the plurality of word lines WL0, WL1, WL2, ..., so as to extend in parallel with each other within a plane parallel to a main surface of the semiconductor substrate and so as to three-dimensionally cross the plurality of word lines WL0, WL1, WL2, ....

Further, a plurality of memory cells M111, M112, M113, ... M121, M122, M123, ... M131, M132, M133, ... (hereinafter expressed as "memory cells M111. MC112, ... ") are arranged in matrix so as to respectively correspond to the three-dimensional cross points of the plurality word lines WL0, WL1, WL2, ..., and the plurality bit lines BL0, BL1, BL2 ...

The memory cells M111, M112, ... correspond to the nonvolatile memory elements according to Embodiment 1, and each of them has a resistance variable layer comprising tantalum oxide. It should noted that in this embodiment, each of these memory cells M111, M112, ... includes a current controlling element as described later.

The memory cells M111, M112, ... in FIG. 14 are identified by reference numeral 210 in FIG. 15.

[Configuration of Nonvolatile Memory Element Included in Nonvolatile Memory Device according to Embodiment 2]

FIG. 16 is a cross-sectional view showing a configuration of the nonvolatile memory element included in the nonvolatile memory device according to Embodiment 2 of the present invention. In FIG. 16, a configuration of part B in FIG. 15 is shown.

As shown in FIG. 16, a nonvolatile memory element 210 included in the nonvolatile memory device according to this embodiment intervenes between a lower wire 212 (corresponding to the word line WL1 in FIG. 15) which is a copper wire and an upper wire 211 (corresponding to the bit line BL1 in FIG. 15) which is a copper wire, and includes a lower electrode 217, a current controlling element 216, an inner electrode 215, a resistance variable layer 214, and an upper electrode 213 which are stacked in this order.

The inner electrode 215, the resistance variable layer 214, and the upper electrode 213 correspond to the first electrode layer 103, the resistance variable layer 104, and the second electrode layer 105 in the nonvolatile memory element 100 according to Embodiment 1 shown in FIG. 1, respectively. Therefore, the resistance variable layer 214 is formed as in Embodiment 1.

The current controlling element 216 is connected in series with the resistance variable layer 214 via the inner electrode 215 comprising TaN. The current controlling element 216 is electrically connected to the resistance variable layer 214. The current controlling element 216 is an element which is typically a MIM (Metal-Insulator-Metal) diode or a MSM (Metal-Semiconductor-Metal) diode, and exhibits a nonlinear current characteristic with respect to a voltage. The current controlling element 216 has a bidirectional non-linear current characteristic with respect to a voltage, and is placed in a conductive state by application of a voltage which is larger in absolute value than a predetermined threshold Vf (e.g., a voltage which is not lower than +1V or not higher than −1V, if Vf=+1V or −1V on the basis of one electrode as a reference).

Tantalum and tantalum oxide are materials generally used in semiconductor process steps, and could be highly compatible with the semiconductor process steps. Therefore, they can be easily incorporated into the existing semiconductor manufacturing process steps.

[Exemplary Configuration of Nonvolatile Memory Device Having a Multi-Layer Structure]

The memory arrays of the nonvolatile memory device according to this embodiment shown in FIGS. 14 and 15 may be three-dimensionally stacked to attain a nonvolatile memory device having a multi-layer structure.

FIG. 17 is a perspective view showing a configuration of a memory array included in the nonvolatile memory device having the multi-layer structure of the present invention. As shown in FIG. 17, the nonvolatile memory device includes a multi-layer memory array having a plurality of layers of stacked memory arrays each including a plurality of lower wires 212 formed on a semiconductor substrate (not shown), to extend in parallel with each other, a plurality of upper wires 211 formed above the plurality of lower wires 212 so as to extend in parallel with each other within a plane parallel to a main surface of the semiconductor substrate and so as to three-dimensionally cross the plurality of lower wires 212, and a plurality of memory cells 210 arranged in matrix to respectively correspond to three-dimensional cross points of the plurality of lower wires 212 and the plurality of upper wires 211.

In the example shown in FIG. 17, the wire layers are composed of five layers and the nonvolatile memory elements arranged at the three-dimensional cross points are composed of four layers. Alternatively, the number of these layers may be increased or decreased as desired.

By providing the multi-layer memory array configured as described above, a nonvolatile memory having a super-large capacity is attainable.

As already described in Embodiment 1, the resistance variable layer of the present invention can be formed at a low temperature. Therefore, transistors or wire material such as silicide formed in a lower layer step are not affected even when a layered structure is formed in a wiring step illustrated in this embodiment. As a result, a multi-layer memory array is easily attainable. That is, a nonvolatile memory device having a multi-layer structure can be easily attained by using the resistance variable layer comprising the tantalum oxide of the present invention.

Embodiment 3

A nonvolatile memory device according to Embodiment 3 is a nonvolatile memory device which includes the nonvolatile memory element according to Embodiment 1, and has a memory array in which memory cells are each composed of one transistor and one nonvolatile memory section which are connected in series with each other.

[Configuration of Nonvolatile Memory Device According to Embodiment 3]

FIG. 18 is a block diagram showing a configuration of a nonvolatile memory device according to Embodiment 3 of the present invention. FIG. 19 is a cross-sectional view showing a configuration (configuration corresponding to 2 bits) in part C of FIG. 18.

As shown in FIG. 18, a nonvolatile memory device 300 according to this embodiment includes a memory main section 301 on a semiconductor substrate. The memory main section 301 includes a memory array 302, a row select circuit/driver 303, a column select circuit 304, a write circuit 305 for writing data, a sense amplifier 306 which detects an amount of a current flowing in a selected bit line and determines the data as "1" or "0," and a data input/output circuit 307 which executes input/output processing of input/output data via the terminal DQ. The nonvolatile memory device 300 further includes a cell plate electric power supply (VCP electric power supply) 308, an address input circuit 309 which receives address signals externally input, and a control circuit 310 for controlling the operation of the memory main section 301, based on the control signal externally input.

The memory array 302 includes the plurality of word lines WL0, WL1, WL2, ... and the plurality of bit lines BL0, BL1, BL2, ... which are formed on the semiconductor substrate and are arranged to three-dimensionally cross each other, a plurality of transistors T11, T12, T13, ... T21, T22, T23, ... T31, T32, T33, ... (hereinafter expressed as "transistors T11, T12, ... ") provided to respectively correspond to three-dimensional cross-points of the word lines WL0, WL1, WL2, ... and the bit lines BL0, BL1, BL2, and a plurality of memory cells M211, M212, M213, ... M221, M222, M223, ... (hereinafter expressed as "memory cells M211, M212, ... " provided to respectively correspond to the transistors T11, T12, ... such that one memory cell corresponds to one transistor.

The memory array 302 further includes a plurality of plate lines PL0, PL1, PL2, ... which are arranged to extend in parallel with the word lines WL0, WL1, WL2, ... The plate lines PL0, PL1, PL2, ... are connected to a VCP electric power supply 308. The plate lines PL0, PL1, PL2, ... may be arranged in parallel with, for example, the bit lines BL0, BL1, BL2, ... The plate lines PL0, PL1, PL2, ..., and the bit lines BL0, BL1, BL2, ... are exemplary wires through which a voltage is applied to the memory cells M211, M212, ... The plate lines are held at a predetermined constant electric potential. The plate lines may be configured as desired and are not limited to a group of a plurality of parallel lines. Alternatively, every individual plate line may be provided with a select circuit/driver and may be fed with an electric potential made different according to whether the plate line is selected or unselected.

As shown in FIG. 19, the bit line BL0 is disposed above the word lines WL0 and WL1, and the plate lines PL0 and PL1 are disposed between the word lines WL0 and WL1 and the bit line BL0.

Each of the memory cells M211, M212, ... corresponds to the nonvolatile memory element according to Embodiment 1, and includes a resistance variable layer comprising tantalum oxide. To be specific, the nonvolatile memory element 313 in FIG. 19 corresponds to the memory cells M211, M212, ... in FIG. 18, and is constituted by the upper electrode 314, the resistance variable layer 315 comprising tantalum oxide, and the lower electrode 316.

In FIG. 19, 317 denotes a plug layer, 318 denotes a metal wire layer, and 319 denotes source/drain regions.

As shown in FIG. 18, drains of the transistors T11, T12, T13, ... are connected to the bit line BL0, drains of the transistors T21, T22, T23, ... are connected to the bit line BL1, and drains of the transistors T31, T32, T33, ... are connected to the bit line BL2.

Gates of the transistors T11, T21, T31, ... are connected to the word line WL0, gates of the transistors T12, T22, T32, ... are connected to the word line WL1, and gates of the transistors T13, T23, T33, ... are connected to the word line WL2.

Sources of the transistors T11, T12, ... are connected to the memory cells M211, M212, ..., respectively.

The memory cells M211, M221, M231, ... are connected to the plate line PL0, the memory cells M212, M222, M232, ... are connected to the plate line PL1, and the memory cells M213, M223, M233, ... are connected to the plate line PL2.

The address input circuit 309 receives address signals from an external circuit (not shown), and outputs row address signals and column address signals to the row select circuit/driver 303 and to the column select circuit 304, respectively, based on the address signals. The address signals are signals indicating the address of a specified memory cell to be selected from among the plurality of memory cells M211, M212, ... The row address signals are signals indicating a row address in the address indicated by the address signals, and the column address signals are signals indicating a column address in the address indicated by the address signals.

In a write cycle of data, the control circuit 310 outputs to the write circuit 305, a write signal for causing application of a write voltage, according to the input data Din input to the data input/output circuit 307. On the other hand, in a read cycle of data, the control circuit 310 outputs to the column select circuit 304, a read signal for causing application of a read voltage.

The row select circuit/driver 303 receives the row address signals output from the address input circuit 309, selects one from among the plurality of word lines WL0, WL1, WL2, ... according to the row address signals, and applies to the selected word line a predetermined voltage (e.g., +3.0V in the case of 3V-level NMOS transistor) sufficient to turn ON the selected transistor.

The column select circuit 304 receives column address signals output from the address input circuit 309, selects one corresponding to the column address signals, from among the plurality bit lines BL0, BL1, BL2, according to the column address signals, and applies the write voltage or the read voltage to the selected bit line. The write voltage is applied between the upper electrode 314 and the lower electrode 316 of the selected memory cell and is a voltage (e.g., in the example of FIG. 8C, −2.0V for changing the element to the low-resistance state and +3.0V for changing the element to the high-resistance state) which is not less than a threshold voltage which is required for the memory cell (resistance variable layer) to change its resistance. The read voltage is desirably a voltage which is smaller than the threshold so as not to cause the selected memory cell to change its resistance during read and which allows a sufficient read current to be obtained. The plurality of plate lines PL0, PL1, PL2, ... are held at a predetermined constant electric potential (e.g., ground electric potential) by the VCP electric power supply 308. The write voltage or the read voltage is applied between the plurality bit lines BL0, BL1, BL2, ... and the plurality of plate lines PL0, PL1, PL2, (to be precise, VCP electric power supply 308). Alternatively, every individual plate line may be provided with a select circuit/driver and may be fed with an electric potential made different according to whether the plate line is selected or unselected.

Receiving the write signal output from the control circuit 310, the write circuit 305 outputs to the column select circuit 304, a signal for causing application of the write voltage to the selected bit line.

In the read cycle of data, the sense amplifier 306 detects an amount of a current flowing in the selected bit line which is a read target, and determines the data as "1" or "0." The resulting output data DO is output to the external circuit via the data input/output circuit 307.

In Embodiment 3 using the configuration including one transistor/one nonvolatile memory section, a storage capacity is smaller than that of the cross-point configuration in Embodiment 2. However, since Embodiment 3 may dispense with the current controlling element such as the diode, it has an advantage that it is easily combined with the CMOS process, and operation control therefor is easy.

As in Embodiment 2, the resistance variable layer of the present invention can be formed at a low temperature. Therefore, it is advantageous that transistors and wire material such as silicide formed in a lower layer step are not affected even when a layer structure is formed in a wiring step as illustrated in this embodiment.

Furthermore, as in Embodiment 2, since the layer deposition of tantalum and tantalum oxide is easily incorporated into the existing semiconductor manufacturing process steps, the nonvolatile memory device of this embodiment can be easily manufactured.

[Measurement Results of Nonvolatile Memory Element]

A resistance changing characteristic of the element including the resistance variable layer and the transistor was measured and dependency on the platinum content of the electrode layer was researched. FIGS. 20A to 20E are views each showing relationship between a cell current and a normalized expected value, and showing cases where platinum contents of the second electrode layer are made different from each other. A transistor having a 1.8V-level and a gate width of 0.44 μm was used. A pulse of 1.8V was applied. As the platinum content of the material constituting the electrode layer decreased, a distribution characteristic of HR and a distribution characteristic of ER improved and an operation window increased. In particular, when the platinum contents were 92 atm % and 89 atm %, a good operation window was confirmed. However, any resistance changing phenomenon was not observed in the element with a platinum content of 86 atm %, because 1.8V pulse was an insufficient voltage.

The inventors studied a variation in cell current values (IHR) corresponding to the high-resistance state and a variation in cell current values (ILR) corresponding to the low-resistance state.

FIGS. 21A to 21D are views each showing a relationship between the number of times pulses are applied, and IHR and ILR, and showing relationships in cases where the platinum contents of the second electrode layer are made different from each other. FIGS. 22A to 22D are views each showing a relationship between IHR and ILR and a normalized expected value, and showing relationships in cases where the platinum contents of the second electrode layer are made different from each other. In this measurement, a transistor having a gate width of 0.44 μm and a 3.3V-level was used. The read voltage was 0.4V. A variation in IHR and a variation in ILR were lessened as the platinum content decreased. In particular, when the platinum content was 89 atm %, an element with good distributions was attained. From the above results, it is preferred that the platinum content be more than 86 atm % and not more than 92 atm % to manufacture a nonvolatile memory element having a lessened variation characteristic.

Embodiment 4

A nonvolatile semiconductor device according to Embodiment 4 is a nonvolatile semiconductor device which includes the nonvolatile memory element according to Embodiment 1 having a programming function and a logic circuit for executing predetermined calculation.

[Configuration of Nonvolatile Semiconductor Device]

FIG. 23 is a block diagram showing a configuration of a nonvolatile semiconductor device according to Embodiment 4 of the present invention.

As shown in FIG. 23, a nonvolatile semiconductor device 400 according to this embodiment includes, on a semiconductor substrate 401, a CPU 402, an input/output circuit 403 for inputting/outputting data to/from an external circuit, a logic circuit 404 for executing predetermined calculation, an analog circuit 405 for processing an analog signal, a BIST (Built In Self Test) circuit 406 for performing self diagnosis, a SRAM 407, and an address storage register for redundancy 408 which is connected to the BIST circuit 406 and to the SRAM 407 and contains specific address data.

FIG. 24 is a block diagram showing a configuration of an address storage register for redundancy included in the nonvolatile semiconductor device according to Embodiment 4 of the present invention. FIG. 25 is a cross-sectional view showing a configuration of the address storage register for redundancy.

As shown in FIGS. 24 and 25, the address storage register for redundancy 408 includes a nonvolatile memory element 409 corresponding to the nonvolatile memory element according to Embodiment 1, a write circuit 410 for writing specific address data to the nonvolatile memory element 409, a read circuit 411 for reading the address data written in the nonvolatile memory element 409, and a latch circuit 412.

The nonvolatile memory element 409 is connected to a switch section to the write circuit 410 side and a switch section to the read circuit 411 side, and has a structure in which the resistance variable layer 421 is sandwiched between the upper electrode 422 and the lower electrode 423. The nonvolatile memory element 409 corresponds to the nonvolatile memory element according to Embodiment 1.

In FIG. 25, 424 denotes a plug layer, 425 denotes a metal wire layer, and 426 denotes a source/drain layer.

Whereas in this embodiment, two-layer wires are provided and the nonvolatile memory element is provided between the first wire and the second wire, for example, multi-layer wires of three or more layers may alternately be provided and the nonvolatile memory element may be disposed between desired wires. In further alternative, the nonvolatile memory element may be disposed between a plurality of wires as desired.

[Exemplary Operation of Nonvolatile Semiconductor Device]

The following will describe an exemplary operation of the nonvolatile semiconductor device according to this embodiment configured as described above.

Hereinafter, a case where the address data is written to the address storage register for redundancy 408 will be described. The BIST circuit 406 inspects a memory block in the SRAM 407, when receiving a diagnosis command signal TST.

The memory block is inspected during inspection in manufacturing process steps of LSI, and during various diagnostic processes carried out in the case where the LSI is mounted to an actual system.

If a faulty bit is detected as a result of inspection of the memory block, the BIST circuit 406 outputs write data command signal WD to the address storage register for redundancy 408. Receiving the write data command signal WD, the address storage register for redundancy 408 stores therein address data corresponding to the faulty bit.

The address data is stored by changing the resistance state of the resistance variable layer in the associated register to the high-resistance state or to the low-resistance state, according to the address data. The changing of the resistance variable layer to the high-resistance state or to the low-resistance state is performed like Embodiment 1.

In this way, the address data is written to the address storage register for redundancy 408. Upon the SRAM 407 being accessed, the address data written in the address storage register for redundancy 408 is read. The address data is read by detecting an output current value corresponding to the resistance state of the resistance variable layer like Embodiment 1.

When the address data read from the address storage register for redundancy 408 matches the address data of an access target, a backup redundant memory cell provided within the SRAM 407 is accessed, so that data is read or written.

The self-diagnosis performed in the above described manner eliminates a need for an expensive LSI tester provided externally, in inspection in the manufacturing process steps. In addition, the self diagnosis has an advantage that at-speed test is available. Furthermore, the self diagnosis has an advantage that since faulty bits can be relieved after a lapse of time as well as in the inspection, a high quality can be maintained for a long period of time.

The nonvolatile semiconductor device according to this embodiment is applicable to a case where data is written only once in the manufacturing process steps and to a case where data is rewritten repeatedly after shipment of products.

[Method of Manufacturing Nonvolatile Semiconductor Device]

The following will describe a manufacturing method of the nonvolatile semiconductor device according to this embodiment as described above.

FIG. 26 is a flowchart showing a main flow of manufacturing process steps of the nonvolatile semiconductor device according to Embodiment 4 of the present invention.

Initially, a transistor is formed on the semiconductor substrate (S101). Then, a first via is formed (S102), and a first wire is formed thereon (S103).

Then, the resistance variable layer is formed on the first wire formed in S103 (S104). The resistance variable layer is formed as described in Embodiment 1.

Then, a second via is formed on the resistance variable layer (S105), and further, a second wire is formed thereon (S106).

As described above, the manufacturing method of the nonvolatile semiconductor device of this embodiment is such that the step of forming the electrodes and the resistance variable layer is added to the manufacturing process steps of the CMOS process. Therefore, the nonvolatile semiconductor device can be easily manufactured by utilizing the existing CMOS process. In addition, since additional steps are fewer and the thickness of the resistance variable layer is relatively small, the time of the process can be shortened.

As in the case of Embodiment 2, the resistance variable layer of the present invention can be formed at a low temperature. Therefore, it is advantageous that transistors and wire material such as silicide formed in a lower layer step are not affected even when a layer structure is formed in a wiring step illustrated in this embodiment.

Since the electrode portion can be formed with 1 µm square or smaller and other circuits can be formed in the CMOS process, a small-sized nonvolatile switch circuit can be easily implemented.

Instead of using the nonvolatile memory element including the resistance variable layer comprising tantalum oxide in Embodiment 1, the nonvolatile semiconductor device may be implemented by using a known flash memory nonvolatile memory element or a known FeRAM memory nonvolatile memory element. In these cases, however, a special process step and material become necessary, which makes it difficult that these nonvolatile memory elements are compatible with the CMOS process. For this reason, a cost problem arises, and the manufacturing steps significantly increases, which is not practical. Further, a problem arises, that it is difficult to use these nonvolatile memory elements as the programming elements, because writing and reading of data are complicated in these memory elements.

As a configuration which is compatible with the CMOS process, there is a memory cell called a CMOS nonvolatile memory cell, which operates equivalently to the flash memory cell by floating the gate wires in the CMOS process. However, such a configuration raises problems that an area of the element section increases and control of its operation is complicated.

The configuration using an electric fusing element such as a silicide fusing element may be compatible with the CMOS process. In this case, problems that rewriting of the data cannot be performed, and the area of the electrode section increases arise.

The wires may be trimmed by a known laser. In this case, miniaturization is constrained by a mechanical precision of a laser trimmer, which is limited only in a manufacturing process, and therefore cannot be realized. Or, there is a limitation on layout, because the wires must be positioned as an uppermost layer.

Whereas the nonvolatile memory element in Embodiment 1 is used as the address storage register for redundancy of the SRAM, the following application examples may be alternatively used. For example, the nonvolatile memory element in Embodiment 1 may be used as the address storage register for redundancy for faulty bits in DRAM, ROM, or the nonvolatile memory devices according to Embodiment 2 and Embodiment 3.

The nonvolatile memory element may be applied to a nonvolatile switch for switching a faulty logic circuit or a backup logic circuit. Furthermore, the nonvolatile memory element may be used as a register for adjusting a voltage in an analog circuit and for adjusting timing in the analog circuit, a register for modifying a ROM which is a product, a nonvolatile switch element for reconfigurable logic and EPGA, and a nonvolatile register.

Other Embodiment

The nonvolatile semiconductor device according to Embodiment 4 may be configured to include the nonvolatile memory device according to Embodiment 2, that is, to integrate on one semiconductor substrate, the cross-point nonvolatile memory device according to Embodiment 2 and the LSI having the CPU or the like according to Embodiment 4.

In this case, the cross-point type nonvolatile memory device according to Embodiment 2 and the LSI having the CPU or the like according to Embodiment 4 may be formed on different semiconductor substrates, and thereafter may be molded into one package.

The nonvolatile semiconductor device according to Embodiment 4 may be configured to include the nonvolatile memory device according to Embodiment 3, that is, to integrate on one semiconductor substrate the nonvolatile memory device having the one transistor/one nonvolatile memory section configuration according to Embodiment 3 and the LSI having the CPU or the like according to Embodiment 4.

In this case, also, the nonvolatile memory device having the one transistor/one nonvolatile memory section configuration according to Embodiment 3 and the LSI having the CPU or the like according to Embodiment 4 may be formed on different semiconductor substrates, and thereafter may be molded into one package.

Although in the above described embodiment, the resistance variable layer comprises tantalum oxide, a resistance variable layer comprising other elements in minute amount may be used as the resistance variable layer sandwiched between the upper and lower electrodes, so long as it includes a tantalum oxide layer as the resistance variable layer for exhibiting resistance change. Other elements may be incorporated into the resistance variable layer in minute amount intentionally, for the purpose of fine adjustment of the resistance value, or the like. Such a configuration is also within the scope of the present invention. For example, incorporating nitrogen into the resistance variable layer can increase the resistance value of the resistance variable layer and improve a responsiveness of resistance change.

Therefore, the limitations recited in claims that the resistance variable layer includes a first tantalum oxide layer comprising first tantalum oxide and a second tantalum oxide layer comprising second tantalum oxide different in oxygen content from the first tantalum oxide such that the first tantalum oxide layer and the second tantalum oxide layer are stacked together, and being configured such that $0<x<2.5$ is satisfied when the first tantalum oxide is expressed as TaO$_x$, and $x<y\leq2.5$ is satisfied when the second tantalum oxide is expressed as TaO$_y$, are not intended to eliminate a potential that each of the first tantalum oxide layer and the second tantalum oxide layer comprises impurities (added substances for fine adjustment of the resistance value) other than the tantalum oxide.

Although a minute amount of unexpected elements might make an ingress into a resistive layer due to remaining gases or gases released through a vacuum container wall in some occasions, when the resistive layer is deposited by sputtering, the resistive layer including such a minute amount of elements may be within the scope of the present invention, as a matter of course.

INDUSTRIAL APPLICABILITY

A nonvolatile memory element, a nonvolatile memory device, and a nonvolatile semiconductor device of the present invention are capable of high-speed operation and have a stable rewrite characteristic. They are useful as nonvolatile memory elements, and the like which are incorporated into a variety of electronic equipment such as digital home electric appliances, memory cards, cellular phones, and personal computers.

A manufacturing method of a nonvolatile memory element of the present invention is useful as the manufacturing method of the nonvolatile memory element, which element are capable of high-speed operation and have a stable rewrite characteristic and are incorporated into a variety of electronic equipment such as digital home electric appliances, memory cards, cellular phones, and personal computers.

| Reference Signs Lists | |
|---|---|
| 100 | nonvolatile memory element |
| 101 | substrate |
| 102 | oxide layer |
| 103 | first electrode layer |
| 104 | resistance variable layer |
| 105 | second electrode layer |
| 107 | low-degree oxidization layer |
| 108 | high-degree oxidization layer |
| 200 | nonvolatile memory device |
| 201 | memory main section |
| 202 | memory array |
| 203 | row select circuit/driver |
| 204 | column select circuit/driver |
| 205 | write circuit |
| 206 | sense amplifier |
| 207 | data input/output circuit |
| 208 | address input circuit |
| 209 | control circuit |
| 210 | nonvolatile memory element |
| 211 | upper wire |
| 212 | lower wire |
| 213 | upper electrode |
| 214 | resistance variable layer |
| 215 | inner electrode |
| 216 | current controlling element |
| 217 | lower electrode |
| 218 | ohmic resistance layer |
| 219 | second resistance variable layer |
| 300 | nonvolatile memory device |
| 301 | memory main section |
| 302 | memory array |
| 303 | row select circuit/driver |
| 304 | column select circuit |
| 305 | write circuit |
| 306 | sense amplifier |
| 307 | data input/output circuit |
| 308 | cell plate electric power supply |

-continued

| Reference Signs Lists | |
|---|---|
| 309 | address input circuit |
| 310 | control circuit |
| 313 | nonvolatile memory element |
| 314 | upper electrode |
| 315 | resistance variable layer |
| 316 | lower electrode |
| 400 | nonvolatile semiconductor device |
| 401 | semiconductor substrate |
| 402 | CPU |
| 403 | input/output circuit |
| 404 | logic circuit |
| 405 | analog circuit |
| 406 | BIST circuit |
| 407 | SRAM |
| 408 | address storage register for redundancy |
| 409 | nonvolatile memory element |
| 410 | write circuit |
| 411 | read circuit |
| 412 | latch circuit |
| BL0, BL1, | bit line |
| M11, M12, | memory cells |
| T11, T12, | transistor |
| WL0, WL1, | word line |

The invention claimed is:

1. A nonvolatile memory element comprising:
a first electrode;
a second electrode; and
a resistance variable layer disposed between the first electrode and the second electrode, resistance values of the resistance variable layer reversibly changing in response to electric signals applied between the first electrode and the second electrode;
the resistance variable layer including a first tantalum oxide layer comprising a first tantalum oxide and a second tantalum oxide layer comprising a second tantalum oxide which is different in oxygen content from the first tantalum oxide, the first tantalum oxide layer and the second tantalum oxide layer being stacked together, and being configured such that $0<x<2.5$ is satisfied when the first tantalum oxide is expressed as TaO$_x$ and $x<y\leq2.5$ is satisfied when the second tantalum oxide is expressed as TaO$_y$;
the second electrode being in contact with the second tantalum oxide layer and comprising platinum and tantalum; and
the second electrode having a platinum content which is not less than 27 atm % and not more than 92 atm %.

2. The nonvolatile memory element according to claim 1, wherein the second electrode includes an alloy of platinum and tantalum, and a platinum content in the alloy is not less than 27 atm % and not more than 92 atm %.

3. The nonvolatile memory element according to claim 1, wherein the second electrode has a platinum content which is not less than 56 atm % and not more than 92 atm %.

4. The nonvolatile memory element according to claim 3, wherein when a thickness of the second tantalum oxide layer is Y(nm), an upper limit value of the platinum content of the second electrode is a value expressed as [3.65Y+60.7] (atm %).

5. A nonvolatile memory device comprising:
a semiconductor substrate; and
a memory array including a plurality of first wires formed on the semiconductor substrate to extend in parallel with each other; a plurality of second wires formed above the plurality of first wires to extend in parallel with each other within a plane parallel to a main surface of the semiconductor substrate and to three-dimensionally cross the plurality of first wires, respectively; nonvolatile memory elements which are provided to respectively correspond to three-dimensional cross points of the plurality of first wires and the plurality of second wires; and current controlling elements having a non-linear current-voltage characteristic;

each of the nonvolatile memory elements including:

a first electrode disposed between a corresponding one of the first wires and a corresponding one of the second wires and electrically connected to the first wire; a second electrode disposed between the corresponding one of the first wires and the corresponding one of the second wires and electrically connected to the second wire; and a resistance variable layer disposed between the first electrode and the second electrode, resistance values of the resistance variable layer reversibly changing in response to electric signals applied between the first electrode and the second electrode;

the resistance variable layer including a first tantalum oxide layer comprising a first tantalum oxide and a second tantalum oxide layer comprising a second tantalum oxide which is different in oxygen content from the first tantalum oxide, the first tantalum oxide layer and the second tantalum oxide layer being stacked together, and being configured such that $0<x<2.5$ is satisfied when the first tantalum oxide is expressed as $TaO_x$ and $x<y\leq 2.5$ is satisfied when the second tantalum oxide is expressed as $TaO_y$;

the second electrode being in contact with the second tantalum oxide layer and comprising platinum and tantalum, and the second electrode having a platinum content which is not less than 27 atm % and not more than 92 atm %.

6. The nonvolatile memory device according to claim 5, wherein the second electrode includes an alloy of platinum and tantalum, and a platinum content in the alloy is not less than 27 atm % and not more than 92 atm %.

7. The nonvolatile memory device according to claim 5, wherein the second electrode has a platinum content which is not less than 56 atm % and not more than 92 atm %.

8. The nonvolatile memory device according to claim 7, wherein when a thickness of the second tantalum oxide layer is Y(nm), an upper limit value of the platinum content of the second electrode is a value expressed as [3.65Y+60.7] (atm %).

9. The nonvolatile memory device according to claim 5, comprising a multi-layer memory array in which a plurality of layers of the memory array are stacked together on the semiconductor substrate.

10. A nonvolatile memory device comprising:

a semiconductor substrate;

a plurality of word lines formed on the semiconductor substrate to extend in parallel with each other;

a plurality of bit lines formed to extend in parallel with each other and arranged to three-dimensionally cross the plurality of word lines, respectively;

a plurality of plate lines formed to extend in parallel with each other and arranged in parallel with either the plurality of word lines or the plurality of bit lines;

a plurality of transistors provided to respectively correspond to three-dimensional cross points of the plurality of word lines and the plurality of bit lines, respectively; and a plurality of nonvolatile memory elements provided to respectively correspond to the plurality of transistors such that one nonvolatile memory element corresponds to one transistor;

each of the plurality of nonvolatile memory elements including a first electrode, a second electrode, and a resistance variable layer disposed between the first electrode and the second electrode, resistance values of the resistance variable layer changing reversibly in response to electric signals applied between a corresponding one of the bit lines and a corresponding one of the plate lines and applied between the first electrode and the second electrode via a corresponding one of the transistors;

one of the first electrode and the second electrode of the nonvolatile memory element being connected to one of a source and a drain of a corresponding one of the transistors;

gates of the plurality of transistors being connected to corresponding ones of the word lines, respectively;

the other of the first electrode and the second electrode of the nonvolatile memory element being connected to one of either a corresponding one of the bit lines or a corresponding one of the plate lines;

the other of the source and the drain of the transistor is connected to the other of either the corresponding one of the bit lines or the corresponding one of the plate lines;

the resistance variable layer including a first tantalum oxide layer comprising a first tantalum oxide and a second tantalum oxide layer comprising a second tantalum oxide which is different in oxygen content from the first tantalum oxide, the first tantalum oxide layer and the second tantalum oxide layer being stacked together, and being configured such that $0<x<2.5$ is satisfied when the first tantalum oxide is expressed as $TaO_x$ and $x<y\leq 2.5$ is satisfied when the second tantalum oxide is expressed as $TaO_y$;

the second electrode being in contact with the second tantalum oxide layer and comprising platinum and tantalum; and the second electrode having a platinum content which is not less than 27 atm % and not more than 92 atm %.

11. The nonvolatile semiconductor device according to claim 10, wherein the second electrode includes an alloy of platinum and tantalum, and a platinum content in the alloy is not less than 27 atm % and not more than 92 atm %.

12. The nonvolatile memory device according to claim 10, wherein the second electrode has a platinum content which is not less than 56 atm % and not more than 92 atm %.

13. The nonvolatile memory device according to claim 12, wherein when a thickness of the second tantalum oxide layer is Y(nm), an upper limit value of the platinum content of the second electrode is a value expressed as [3.65Y+60.7] (atm %).

14. A nonvolatile semiconductor device comprising:

a semiconductor substrate;

a logic circuit provided on the semiconductor substrate, for executing predetermined calculation; and a nonvolatile memory element provided on the semiconductor substrate and having a programming function;

the nonvolatile memory element comprising:

a first electrode;

a second electrode; and a resistance variable layer disposed between the first electrode and the second electrode, resistance values of the resistance variable layer reversibly changing in response to electric signals applied between the first electrode and the second electrode;

the resistance variable layer including a first tantalum oxide layer comprising a first tantalum oxide and a second tantalum oxide layer comprising a second tantalum oxide which is different in oxygen content from the first tantalum oxide, the first tantalum oxide layer and the second tantalum oxide layer being stacked together, and being configured such that $0<x<2.5$ is satisfied when the first tantalum oxide is expressed as $TaO_x$ and $x<y\leq 2.5$ is satisfied when the second tantalum oxide is expressed as $TaO_y$;

the second electrode being in contact with the second tantalum oxide layer and comprising platinum and tantalum; and the second electrode having a platinum content which is not less than 27 atm % and not more than 92 atm %.

15. The nonvolatile semiconductor device according to claim 14, wherein the second electrode includes an alloy of platinum and tantalum, and a platinum content in the alloy is not less than 27 atm % and not more than 92 atm %.

16. The nonvolatile semiconductor device according to claim 14, wherein the second electrode has a platinum content which is not less than 56 atm % and not more than 92 atm %.

17. The nonvolatile semiconductor device according to claim 16, wherein when a thickness of the second tantalum oxide layer is Y(nm), an upper limit value of the platinum content of the second electrode is a value expressed as [3.65Y+60.7] (atm %).

18. A method of manufacturing a nonvolatile memory element including:
   a first electrode;
   a second electrode; and
   a resistance variable layer disposed between the first electrode and the second electrode, resistance values of the resistance variable layer reversibly changing in response to electric signals applied between the first electrode and the second electrode;
   the resistance variable layer including a first tantalum oxide layer comprising a first tantalum oxide and a second tantalum oxide layer comprising a second tantalum oxide which is different in oxygen content from the first tantalum oxide, the first tantalum oxide layer and the second tantalum oxide layer being stacked together, and being configured such that $0<x<2.5$ is satisfied when the first tantalum oxide is expressed as $TaO_x$ and $x<y\leq 2.5$ is satisfied when the second tantalum oxide is expressed as $TaO_y$;
   the second electrode being in contact with the second tantalum oxide layer and comprising platinum and tantalum; and
   the second electrode having a platinum content which is not less than 27 atm % and not more than 92 atm %;
   the method comprising:
   forming the second electrode by cosputtering using a platinum target and a tantalum target, a composition of the second electrode comprising the platinum and the tantalum being controlled by regulating a power intensity applied to each of the targets.

19. A method of manufacturing a nonvolatile memory element including:
   a first electrode;
   a second electrode; and
   a resistance variable layer disposed between the first electrode and the second electrode, resistance values of the resistance variable layer reversibly changing in response to electric signals applied between the first electrode and the second electrode;
   the resistance variable layer including a first tantalum oxide layer comprising a first tantalum oxide and a second tantalum oxide layer comprising a second tantalum oxide which is different in oxygen content from the first tantalum oxide, the first tantalum oxide layer and the second tantalum oxide layer being stacked together, and being configured such that $0<x<2.5$ is satisfied when the first tantalum oxide is expressed as $TaO_x$ and $x<y\leq 2.5$ is satisfied when the second tantalum oxide is expressed as $TaO_y$;
   the second electrode being in contact with the second tantalum oxide layer and comprising platinum and tantalum, and
   the second electrode having a platinum content which is not less than 27 atm % and not more than 92 atm %,
   the method comprising:
   forming a material of the second electrode comprising the platinum and the tantalum by sputtering using a target comprising alloy composed of the platinum and the tantalum.

* * * * *